(12) United States Patent
Cho et al.

(10) Patent No.: US 9,767,407 B2
(45) Date of Patent: Sep. 19, 2017

(54) WEIGHTING DEVICE, NEURAL NETWORK, AND OPERATING METHOD OF THE WEIGHTING DEVICE

(71) Applicant: Samsung Electronics Co., Ltd., Suwon-si, Gyeonggi-do (KR)

(72) Inventors: Seongho Cho, Gwacheon-si (KR); Inkyeong Yoo, Yongin-si (KR); Hojung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/267,600

(22) Filed: Sep. 16, 2016

(65) Prior Publication Data

US 2017/0083811 A1   Mar. 23, 2017

(30) Foreign Application Priority Data

Sep. 18, 2015 (KR) .......... 10-2015-0132607
Jan. 27, 2016 (KR) .......... 10-2016-0010076

(51) Int. Cl.
*G11C 16/10* (2006.01)
*G06N 3/04* (2006.01)
(Continued)

(52) U.S. Cl.
CPC .............. *G06N 3/04* (2013.01); *G11C 11/54* (2013.01); *G11C 11/56* (2013.01); *G11C 13/0002* (2013.01); *G11C 16/0466* (2013.01); *G11C 16/10* (2013.01); *G11C 16/12* (2013.01); *G11C 16/14* (2013.01); *G11C 16/26* (2013.01); *H01L 29/1083* (2013.01); *H01L 29/42328* (2013.01); *H01L 29/42332* (2013.01);
(Continued)

(58) Field of Classification Search
CPC .............................. G11C 16/10; G11C 116/26
USPC ........................................ 365/185.29, 185.24
See application file for complete search history.

(56) References Cited

U.S. PATENT DOCUMENTS 4,961,002 A   10/1990   Tam et al.
6,349,055 B1   2/2002   Murray
(Continued)

FOREIGN PATENT DOCUMENTS

| KR | 20030092132 A | 12/2003 |
|---|---|---|
| KR | 1020110054972 | 5/2011 |
| KR | 1020120114082 | 10/2012 |

OTHER PUBLICATIONS

Hasler et al., "Finding a Roadmap to Achieve Large Neuromorphic Hardware Systems", Frontiers in Neuroscience, vol. 7, Article 118, pp. 1-29, Sep. 2013.

(Continued)

*Primary Examiner* — Michael Tran
(74) *Attorney, Agent, or Firm* — Harness, Dickey & Pierce P.L.C.

(57) ABSTRACT

Provided are a weighting device that may be driven at a low voltage and is capable of embodying multi-level weights, a neural network, and a method of operating the weighting device. The weighting device includes a switching layer that may switch between a high resistance state and a low resistance state based on a voltage applied thereto and a charge trap material layer that traps or discharges charges according to a resistance state of the switching layer. The weighting device may be used for controlling a weight in a neural network.

20 Claims, 20 Drawing Sheets

(51) Int. Cl.
*H01L 29/792* (2006.01)
*H01L 29/423* (2006.01)
*H01L 29/788* (2006.01)
*H01L 29/10* (2006.01)
*G11C 16/04* (2006.01)
*G11C 16/12* (2006.01)
*G11C 16/14* (2006.01)
*G11C 16/26* (2006.01)
*G11C 11/54* (2006.01)
*G11C 11/56* (2006.01)
*G11C 13/00* (2006.01)

(52) U.S. Cl.
CPC .. *H01L 29/42344* (2013.01); *H01L 29/42348* (2013.01); *H01L 29/7881* (2013.01); *H01L 29/792* (2013.01); *G11C 2213/72* (2013.01); *G11C 2213/79* (2013.01)

(56) References Cited

U.S. PATENT DOCUMENTS

| | | | |
|---|---|---|---|
| 6,801,456 B1 * | 10/2004 | Hsu | G11C 16/10 365/185.18 |
| 6,903,361 B2 * | 6/2005 | Gilton | H01L 29/685 257/2 |
| 7,092,923 B2 | 8/2006 | Arima | |
| 7,706,180 B2 * | 4/2010 | Jenne | G11C 16/3418 365/185.02 |
| 7,816,947 B1 * | 10/2010 | Wang | H01L 21/28273 326/122 |
| 7,939,880 B2 * | 5/2011 | Kang | B82Y 10/00 257/319 |
| 8,093,128 B2 * | 1/2012 | Koutny, Jr. | H01L 21/823412 257/324 |
| 8,153,537 B1 * | 4/2012 | Yeong | H01L 21/823807 438/778 |
| 8,344,445 B2 * | 1/2013 | Lu | G11C 17/16 257/314 |
| 8,447,714 B2 | 5/2013 | Breitwisch et al. | |
| 8,463,723 B2 | 6/2013 | Modha et al. | |
| 8,682,822 B2 | 3/2014 | Modha et al. | |
| 8,796,098 B1 * | 8/2014 | Ramkumar | H01L 29/66833 257/324 |
| 8,812,415 B2 | 8/2014 | Modha | |
| 8,892,487 B2 | 11/2014 | Chang et al. | |
| 8,902,651 B2 * | 12/2014 | Kwak | H01L 27/1157 365/185.03 |
| 2003/0098476 A1 | 5/2003 | Arima | |
| 2008/0275832 A1 | 11/2008 | McDaid et al. | |
| 2010/0223220 A1 | 9/2010 | Modha et al. | |
| 2010/0299297 A1 | 11/2010 | Breitwisch et al. | |
| 2011/0153533 A1 | 6/2011 | Jackson et al. | |
| 2012/0265719 A1 | 10/2012 | Modha et al. | |
| 2013/0073497 A1 | 3/2013 | Akopyan et al. | |
| 2014/0188771 A1 | 7/2014 | Modha | |
| 2014/0207719 A1 | 7/2014 | Modha | |
| 2014/0250038 A1 | 9/2014 | Modha | |
| 2014/0258194 A1 | 9/2014 | Towal et al. | |
| 2014/0310220 A1 | 10/2014 | Chang et al. | |

OTHER PUBLICATIONS

Bell et al., "Synaptic Plasticity in a Cerebellum-like Structure Depends on Temporal Order", Nature, vol. 387, No. 15, pp. 278-281, May 1997.

Schemmel et al., "Implementing Synaptic Plasticity in a VLSI Spiking Neural Network Model", 2006 IEEE International Joint Conference on Neural Network Proceedings, Jul. 2006.

Wang et al., "A Possible Model for the Positive Magnetoresistance in Manganite-Based All-Perovskite Oxide Films p-n Junction", Europhysics Letters, vol. 73 (3), pp. 401-407, Feb. 2006.

Burr et al., "Experimental demonstration and Tolerancing of a Large-Scale Neural Network (165,000 Synapes), Using Phase-Change Memory as the Synaptic Weight Element", 2014 IEEE International Electron Devices Meeting, Dec. 2014.

* cited by examiner

WEIGHTING DEVICE, NEURAL NETWORK, AND OPERATING METHOD OF THE WEIGHTING DEVICE

CROSS-REFERENCE TO RELATED APPLICATIONS

This application claims the benefit of Korean Patent Application No. 10-2015-0132607, filed on Sep. 18, 2015, and Korean Patent Application No. 10-2016-0010076, filed on Jan. 27, 2016, in the Korean Intellectual Property Office, the disclosures of which are incorporated herein in their entireties by reference.

BACKGROUND

1. Field

The present disclosure relates to a weighting device capable of embodying multi-level weights, a neural network, and a method of operating the weighting device.

2. Description of the Related Art

There are hundreds of billions of neurons in the brain, and the neurons form a neural network by being connected to one another in a complicated manner. Each of such neurons has synapses for exchanging signals with other neurons, and thus, the neurons may perform functions including learning and memorization. A synapse refers to a connection between neurons, wherein an axon of a pre-synapse to which a signal is transmitted is connected to a dendrite of a post-synapse by which the signal is received. Generally, one neuron has synapses with thousands of other neurons. There have been attempts to develop a neuromorphic network for simulating such a biological neural network. To develop such a circuit, a device having characteristics similar to a neural phenomenon is demanded. A neural network employing the Von Neuman type electronic calculation has been suggested, wherein a weighting device capable of accumulating information based on repeated input signals is used as the core device of the neural network.

SUMMARY

Provided are a weighting device that may be driven at a low voltage and is capable of embodying multi-level weights, a neural network, and a method of operating the weighting device.

According to at least some example embodiments, a weighting device includes a substrate; a first transistor including, a source region and a shared region spaced apart from each other on the substrate; a source electrode electrically connected to the source region; a first channel region between the source region and the shared region; a first gate insulation layer arranged on the first channel region; a charge trap material layer arranged on the first gate insulation layer; a switching layer arranged on the charge trap material layer and configured to switch between a low resistance state and a high resistance state; and a first gate electrode arranged on the switching layer; and a second transistor including, a drain region spaced apart from the shared region on the substrate; a drain electrode electrically connected to the drain region; a second channel region between the shared region and the drain region; a second gate insulation layer arranged on the second channel region; and a second gate electrode arranged on the second gate insulation layer, wherein the charge trap material layer faces a portion of the shared region across the first gate insulation layer.

The first transistor may further include an anti-leakage region on the substrate, the anti-leakage region may constitute a PN diode structure together with the source region, and the source electrode may contact the anti-leakage region.

Except a surface of the anti-leakage region contacting the source electrode, the anti-leakage region may be surrounded by the source region.

The first channel region and the second channel region may have conductive types opposite each other.

The first transistor may further include a well, the well may surround the source region, the first channel region, and the shared region at the substrate, and the well may have a conductive type opposite that of the second channel region.

The first gate electrode and the source electrode may be electrically connected to each other.

The weighting device may further include a boosting electrode that faces the charge trap material layer across the first gate insulation layer and the substrate.

The switching layer may include a nano-filamentary material switchable to the low resistance state as conductive nano-filaments are formed therein when a voltage is applied to the switching layer.

The switching layer may include a PN diode layer.

A method of operating the weighting device includes: opening the second channel region by applying a selection voltage to the second gate electrode; applying a write voltage to the drain electrode; and grounding the first gate electrode, wherein data is written to the charge trap material layer as charges are introduced into the charge trap material layer via the first gate electrode due to the write voltage.

A method of operating the weighting device of claim may include opening the second channel region by applying a selection voltage to the second gate electrode; applying an erase voltage to the first gate electrode; and grounding the drain electrode, wherein data is erased as charges trapped in the charge trap material layer are removed by the erase voltage.

A method of operating the weighting device may include opening the second channel region by applying a selection voltage to the second gate electrode; applying a read voltage to the source electrode; and reading an amount of charges trapped in the charge trap material layer by measuring a sensing current at the drain electrode.

The applying of the write voltage may include adjusting a weight by applying a pulse voltage to the drain electrode, and the adjusting of the weight may be controlled based on a number of times of applying the pulse voltage.

The applying of the erase voltage may include adjusting a weight by applying a pulse voltage to the first gate electrode, and the adjusting of the weight may be controlled based on a number of times of applying the pulse voltage.

A neural network may include a plurality of the weighting devices; and a plurality of neuron transistors configured to selectively switch gate voltages applied to the plurality of weighting devices.

The plurality of neuron transistors may be 2-dimensionally arranged, drain electrodes of the plurality of neuron transistors may be respectively connected to first gate electrodes of the plurality of weighting devices, and the neural network may further include a select line connected to gate electrodes of neuron transistors arranged at a same column, the select line being configured to apply a selection voltage; and an input line connected to source electrodes of neuron transistors arranged at a same row, the input line being configured to apply an input voltage.

The plurality of weighting devices may be 1-dimensionally or 2-dimensionally arranged.

In a method of operating the neural network for supervised learning, input information to be input via the plurality of neuron transistors and output information to be output via the plurality of weighting devices may be determined in advance and a weight of the neural network corresponding thereto is determined.

In a method of operating the neural network of claim 15 for unsupervised learning, a weight of the neural network may be autonomously determined based on input information input via neuron transistors.

According to at least some example embodiments, a weighting device includes a first transistor including a third gate electrode, a first electrode, and a second electrode; a second transistor sharing the second electrode with the first transistor and including a fourth gate electrode and a third electrode; a third transistor including a fifth gate electrode and a fourth electrode and configured to use a shared region as a drain; a fourth transistor including a sixth gate electrode and a fifth electrode and configured to use the shared region as a source; a switching layer arranged on the first electrode and the third electrode and configured to switch between a high resistance state and a low resistance state; a charge trap material layer arranged on the switching layer and configured to trap or release charges according to a resistance state of the switching layer; and an interconnect interconnecting the charge trap material layer and the sixth gate electrode.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
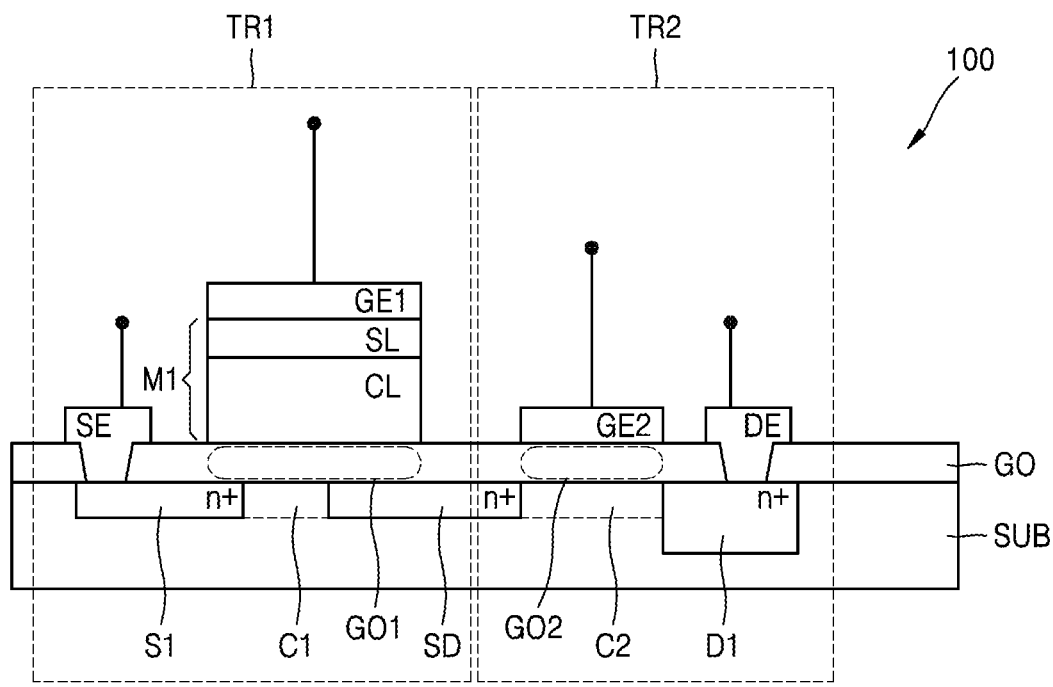
FIG. 1 is a sectional diagram of a weighting device according to at least one example embodiment.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", an and the are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

At least some example embodiments will now be described more fully with reference to the accompanying drawings, in which at least some example embodiments are shown. At least some example embodiments may, however, be embodied in many different forms and should not be construed as being limited to the embodiments set forth herein; rather, these embodiments are provided so that this disclosure will be thorough and complete, and will fully convey the concepts of at least some example embodiments to those skilled in the art. In the drawings, the thicknesses of layers and regions are exaggerated for clarity. Like reference numerals in the drawings denote like elements, and thus their description will be omitted.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Reference will now be made in detail to at least some embodiments, examples of which are illustrated in the accompanying drawings, wherein like reference numerals refer to like elements throughout. In this regard, at least some example embodiments may have different forms and should not be construed as being limited to the descriptions set forth herein. Accordingly, at least some example embodiments are merely described below, by referring to the figures, to explain aspects. Expressions such as "at least one of," when preceding a list of elements, modify the entire list of elements and do not modify the individual elements of the list.

FIG. 1 is a sectional diagram showing a weighting device according to at least one example embodiment. The weighting device according to at least one example embodiment may be understood as having four terminals. In neuroscience or computer science, a weight refers to a strength or intensity of a connection between two nodes. In particular, in a neural network, a weight may refer to an intensity of a signal transmitted to a plurality of neurons connected to a neuron. In mathematical terms, a value input to a pre-neuron is denoted by x, a value output from a post-neuron is denoted by y, a matrix of weights of the pre-neuron and the post-neuron is denoted by $w_{ij}$, and an equation as shown below may be established between x, y, and $w_{ij}$.

$$y_j = \sum_i w_{ij} x_i \qquad \text{[Equation 1]}$$

According to the Equation 1, each of the letters "i" and "j" represents two different indexes. The index "i" and "j" may be a number, or a character. According to Equation 1, a sum of multiples of the input values x input to the pre-neurons and the weight $w_{ij}$ is equal to an output value y. Therefore, when particular input information is applied to a neural network, output values transmitted to the post-neuron may vary according to weight values corresponding to the respective pre-neurons. The process is similar to neurotransmission system of a living organism. An electric pulse signal generated by a pre-neuron of a living organism arrives at a synapse and induces a chemical reaction. A neuro-signal transmitting material formed in the chemical reaction is transmitted to a post-neuron. Based on an amount of the transmitted neuro-signal transmitting material, it is determined whether the post-neuron generates an electric pulse signal again, and thus, an amount of the neuro-signal transmitting material may correspond to the weight $w_{ij}$. A weighting device is a device constituting a neural network that simulates an actual neural network and may be a device capable of storing and reading the weight $w_{ij}$ in and from a multi-level memory. The weighting device may have a transistor-like structure and may include a charge trap material layer CL and a threshold voltage transforming layer TL. A weighting device may receive a pulse signal as an input. The charge trap material layer CL may store various amounts of charges according to the number of input pulse signals. The switching layer SL may prevent leakage of charges trapped by the charge trap material layer CL. Detailed descriptions thereof will be given below.

Referring to FIG. 1, a weighting device according to at least one example embodiment may be arranged on a substrate SUB. The substrate SUB may be a semiconductor substrate. For example, the substrate SUB may include Group IV atoms, such as silicon (Si). The weighting device may include a first transistor TR1 and a second transistor TR2.

The first transistor TR1 may include a source electrode SE and a first gate electrode GE1 and may use a shared region SD as a drain. The first transistor TR1 may include a charge trap layer M1 capable of storing weight values. The charge trap layer M1 may include a switching layer SL that may be switched to a high resistance state or a low resistance state according to an applied voltage and a charge trap material layer CL that traps or releases charges according to a resistance state of the switching layer SL.

The first transistor TR1 may include a first channel region C1. The first transistor TR1 may be a depletion type transistor. The first channel region C1 of the depletion type first transistor TR1 may have an open state in which electricity may flow via the first channel region C1 even when no voltage is applied to the first gate electrode GE1. The first channel region C1 may have a closed state in which electricity may not flow when a negative voltage is applied to the first channel region C1. For example, when sufficient charges are accumulated in the charge trap material layer CL arranged over the first channel region C1, a negative voltage due to the charges may be applied to the first channel region C1, and thus, the first channel region C1 may be closed.

The second transistor TR2 may include a second gate electrode GE2 and a drain electrode DE and may use the shared region SD as a source. The first transistor TR1 may use the shared region SD as the drain. At the same time, the second transistor TR2 may use the shared region SD as the source. The substrate SUB may include a source region S1 and the shared region SD that are apart from each other. The first channel region C1 may be arranged between the source region S1 and the shared region SD.

The second transistor TR2 may include a second channel region C2. The second channel region C2 may be arranged between the shared region SD and the drain region D1. The second transistor TR2 may be of an enhancement type. The second channel region C2 of the enhancement type second transistor TR2 may have an open state in which electricity may flow via the second channel region C2 when a voltage is applied to the second gate electrode GE2. The second channel region C2 may have a closed state in which electricity may not flow via the second channel region C2 when no voltage is applied.

A gate insulation layer GO may be arranged on the substrate SUB. The gate insulation layer GO may be arranged by oxidizing a surface of the substrate SUB. For example, when the substrate SUB includes silicon, the gate insulation layer GO may include a silicon oxide. The gate insulation layer GO may function as a buffer layer. The gate insulation layer GO may function as an insulation layer that insulates gate electrodes and channel regions of the first transistor TR1 and the second transistor TR2. For example, the gate insulation layer GO may function as a first gate insulation layer GO1 that insulates the first channel region C1 and the charge trap layer M1 of the first transistor TR1 from each other. In another example, the gate insulation layer GO may function as a second gate insulation layer GO2 that insulates the second channel region C2 and the second gate electrode GE2 of the second transistor TR2 from each other.

A weighting device 100 arranged on the substrate SUB may be an NMOS type weighting device or a PMOS type weighting device. For example, the NMOS type weighting device 100 may include the substrate SUB doped with a p-type dopant, the source region S1 doped with an n-type dopant, the shared region SD doped with an n-type dopant, and the drain region D1 doped with an n-type dopant. The PMOS type weighting device 100 may be doped with a dopant of conductive type opposite that of the NMOS type weighting device 100. The NMOS type weighting device 100 and the PMOS type weighting device 100 operate according to opposite methods and there are no differences between the technical features thereof. Therefore, although the present embodiment provides the NMOS type weighting device 100, at least some example embodiments are not limited thereto, and the weighting device 100 may also include the p-type weighting device 100. Furthermore, a weighting device may include an N-Well, which is a well including an n-type dopant, or a P-Well, which is a well including a p-type dopant. Detailed descriptions thereof will be given below.

The charge trap layer M1 may include the charge trap material layer CL and the switching layer SL arranged on the charge trap material layer CL. The charge trap material layer CL may be arranged on the first channel region C1 and a portion of the shared region SD near the first channel region C1.

A surface of the charge trap material layer CL may partially face a surface of the shared region SD across the first gate insulation layer GO1. Detailed descriptions thereof will be given below with reference to FIG. 2.

A material constituting the charge trap material layer CL may include a silicon nitride $Si_xN_y$, or polycrystalline silicon. Alternatively, the charge trap material layer CL may include a metal, such as tungsten, molybdenum, cobalt, nickel, platinum, rhodium, palladium, and iridium, a mixture thereof, or an alloy thereof. Alternatively, the charge trap material layer CL may include a semiconductor material, such as silicon, germanium, a mixture of silicon and germanium, a Group III-V compound (a combination of Al, Ga, and In of Group III with P, As, and Sb of Group V), or a Group II-VI comound (a combination of Zn, Cd, and Hg of Group II with O, S, Se, and Te of Group VI). Alternatively, the charge trap material layer CL may include an insulator exhibiting high charge trapping density, such as an aluminum oxide ($Al_2O_3$) film, a hafnium oxide (HfO) film, hafnium-aluminum oxide (HfAlO), and hafnium-silicon oxide (HfSiO) film.

The total amount of charges that may be stored in the charge trap material layer CL may be proportional to the volume of the charge trap material layer CL. Binary information may be stored in the charge trap layer CL based on whether a charge is stored in the charge trap layer CL. For example, "1" may indicate that a charge is stored in the charge trap layer CL and "0" may indicate that a charge is not stored in the charge trap layer CL. Therefore, a digital signal may be stored. Furthermore, the charge trap layer CL may function as a memory cell having a multi-level weight for storing multiple pieces of information step-by-step, according to a stored charge amount. For example, when a maximum charge which may be stored in the charge trap layer CL is represented as 100%, when no charge is stored may be "0", when a 25% charge is stored may be "1", when a 50% charge is stored may be "2", when a 75% charge is stored may be "3", and when a 100% charge is stored may be "4". It may be considered that a single weighting device stores -bit information. As the charge amount is divided among multiple levels, more information may be stored in a device, but errors may increase. The total amount of charges that may be stored in the charge trap material layer CL and the volume of the charge trap material layer CL may be proportional to each other. Therefore, it is possible to realize a multi-level weight having more levels by increasing the volume of the charge trap layer CL. Since multi-level is determined based on an amount of charged trapped by the charge trap material layer CL, the charge trap layer M1 may include the switching layer SL to prevent charge leakage even when a voltage is not applied. Therefore, the charge trap material layer CL may become non-volatile.

The switching layer SL may have a characteristic of a variable resistance material in which the resistance thereof changes according to a voltage applied to the switching layer SL. The switching layer SL may be at a high resistance state or a low resistance state and may be switched to either the high resistance state or the low resistance state according to a voltage applied thereto. For example, resistance of the switching layer SL may be changed in a non-linear fashion according to a voltage applied thereto, where, when a voltage equal to or higher than a particular voltage is applied, resistance of the switching layer SL may be reduced in a non-linear fashion. The resistance state of the switching layer SL when no voltage is applied to the switching layer SL or a voltage lower than the above-stated particular voltage is applied to the switching layer SL may be considered as the high resistance state. Furthermore, when a voltage higher than the above-stated particular voltage is applied to the switching layer SL and the resistance state of the switching layer SL is reduced in a non-linear fashion, the corresponding resistance state of the switching layer SL may be considered as the low resistance state. The particular voltage may be referred to as a threshold voltage. Furthermore, since a weighting device according to at least one example embodiment is able to store a charge without using a tunneling method, degradation of an interface state due to repeated use of a device may be prevented.

The switching layer SL may include a threshold voltage changing material. A threshold voltage changing material refers to a material that normally maintains a high resistance state, is switched to a low resistance state only while a voltage equal to or higher than the unique threshold voltage of the threshold voltage changing material is being applied, and is restored to the high resistance state when the voltage is no longer applied thereto. The switching layer SL including such a threshold voltage changing material blocks movement of charges between the first gate electrode GE1 and the charge trap material layer CL at the high resistance state at which no voltage is applied and allows movement of charges between the first gate electrode GE1 and the charge trap material layer CL at the low resistance state at which a voltage equal to or higher than a threshold voltage is applied.

A threshold voltage changing material may include a chalcogenide-based material or a transition metal oxide, for example. The chalcogenide-based material may include, for example, a transition metal selected from Mo, W, Nb, V, Ta, Ti, Zr, Hf, Tc, and Re and one chalcogen atom selected from S, Se, and Te. The transition metal oxide may include, for example, at least one of Ti oxide, Ta oxide, Ni oxide, Zn oxide, W oxide, Co oxide, Nb oxide, TiNi oxide, LiNi oxide, InZn oxide, V oxide, SrZr oxide, SrTi oxide, Cr oxide, Fe oxide, Cu oxide, Hf oxide, Zr oxide, Al oxide, and mixtures thereof.

The switching layer SL may include a nano-filamentary material that exhibits a low resistance state due to nano-filaments. Detailed descriptions thereof will be given below with reference to FIG. 12.

The switching layer SL may include a PN diode. Detailed descriptions thereof will be given below with reference to FIG. 13.

A weighting device according to the present embodiment may include four terminals. Operations of the weighting device may be controlled via the terminals. The terminals may include the source electrode SE, the first gate electrode GE1, the second gate electrode GE2, and the drain electrode DE. The source electrode SE is connected to the source region S1. The drain electrode DE is connected to the drain region D1. Here, the term "connected" may also indicate an 'electric contact.' An electrode may include a highly electro-conductive metal, e.g., Pd, Pt, Ru, Au, Ag, Mo, Mg, Al, W, Ti, Ir, Ni, Cr, Nd, or Cu. Furthermore, an electrode may include graphene or a transparent conductive metal oxide, such as indium tin oxide (ITO), indium zinc oxide (IZO), aluminum zinc oxide (AZO), or gallium zinc oxide (GZO).

A four-terminal weighting device may be operated by applying voltages to respective electrodes of the weighting device. Operations regarding the respective electrodes will be described below. Hereinafter, it is assumed that the first channel region C1 is depletion type and the second channel region C2 is enhancement type. However, at least some example embodiments are not limited thereto. The first channel region C1 may be depletion type or enhancement type, whereas the second channel region C2 may be depletion type or enhancement type. The types of the first channel region C1 and the second channel region C2 merely change methods of operating a weighting device and may not change characteristics of the weighting device.

The source electrode SE may be related to a reading operation. When a read voltage is applied to the source electrode SE, a sensing current may flow via the first channel region C1. The size of the sensing current may vary based on an amount of charges trapped by the charge trap material layer CL arranged over the first channel region C1. For example, when holes of the first channel region C1 are pulled up by an electric field due to charges trapped by the charge trap material layer CL, an amount of a current flowing via the first channel region C1 may be reduced. As more charges are trapped by the charge trap material layer CL, an amount of a current flowing via the first channel region C1 is further reduced. Therefore, an amount of charges trapped by the charge trap material layer CL may be determined based on the size of a sensing current. For example, an amount of charges trapped by the charge trap material layer CL may be measured based on a reduced amount of a sensing current, based on the size of a sensing current corresponding to a case where no charge is trapped by the charge trap material layer CL.

The first gate electrode GE1 may be related to an erase operation. An erase voltage applied to the first gate electrode GE1 may be transmitted to the shared region SD via the second channel region C2. The erase voltage may be distributed to the switching layer SL, the charge trap material layer CL, and the gate insulation layer GO. When the magnitude of a voltage applied to the switching layer SL is higher than a threshold voltage, the charge trap material layer CL may release charges. When the magnitude of a voltage applied to the switching layer SL is not higher than the threshold voltage, the charge trap material layer CL may not release charges.

The second gate electrode GE2 may be related to selection of a weighting device. When a selection voltage equal to or higher than a particular voltage, the second channel region C2 of the second transistor TR2 may be opened. Since it is necessary for the second channel region C2 of the second transistor TR2 to be opened for a write operation, a read operation, and an erase operation of a weighting device according to the present embodiment, it may be determined whether a weighting device may be selected based on whether a selection voltage is applied to the second gate electrode GE2.

The drain electrode DE may be related to a write operation. A write voltage may be applied to the drain electrode DE. The write voltage applied to the drain electrode DE may be distributed to the switching layer SL, the charge trap material layer CL, and the gate insulation layer GO. When a voltage distributed to the switching layer SL is higher than a threshold voltage, the charge trap material layer CL may trap charges. When a voltage distributed to the switching layer SL is lower than or equal to a threshold voltage, the charge trap material layer CL may not trap charges. As described above, a weighting device according to the present embodiment may have multi-level memory function according to an amount of charges trapped by the charge trap material layer CL.

Figure 2:
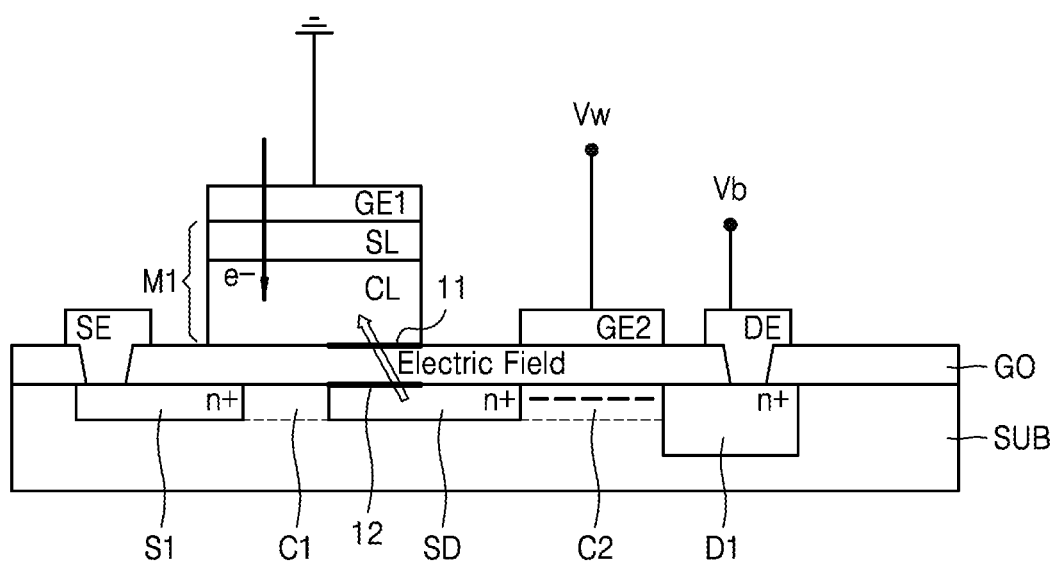
FIG. 2 is a sectional diagram showing a write operation of the weighting device of FIG. 1.

FIG. 2 is a sectional diagram showing a write operation of the weighting device of FIG. 1.

Referring to FIG. 2, a write voltage Vb is applied to the drain electrode DE of the weighting device, a selection voltage Vw is applied to the second gate electrode GE2, and the first gate electrode GE1 may be grounded. The second channel region C2 is opened by the selection voltage Vw, and the write voltage Vb applied to the drain electrode DE may be transmitted to the shared region SD. The write voltage Vb applied to the shared region SD may slightly drop as the write voltage Vb passes through a second channel region. Since a surface of the shared region SD partially faces a surface of the charge trap material layer CL, the write voltage Vb transmitted to the shared region SD may contribute to an electric field formed at the charge trap material layer CL.

A voltage applied to the charge trap material layer CL may be applied via the surface of the shared region SD facing the charge trap material layer CL. Referring to FIG. 2, a first upper surface 11, which is a surface of the charge trap material layer CL close to the shared region SD, and a first lower surface 12, which is a surface of the shared region SD close to the first channel region C1, may face each other. An electric field due to the write voltage Vb may be formed between the first upper surface 11 and the first lower surface 12. The first upper surface 11 and the first lower surface 12 facing each other may be large enough to form an electric field between the shared region SD and the charge trap material layer CL. For example, when the first upper surface 11 and the first lower surface 12 facing each other are too small, an electric field may not be sufficiently formed between the shared region SD and the charge trap material layer CL.

Since the first gate electrode GE1 is grounded, the write voltage Vb may be distributed to the gate insulation layer GO, the charge trap layer M1, and the first gate electrode GE1 of the first transistor TR1. The write voltage Vb may be distributed according to a resistance value of each layer. For example, the write voltage Vb may be distributed as a voltage Vt applied to the switching layer SL, a voltage Vc applied to the charge trap material layer CL, and a voltage Vi applied to the gate insulation layer GO. For example, when the voltage Vt is higher than the threshold voltage Vth of the switching layer SL, the switching layer SL is switched to a low resistance state, and thus the charge trap material layer CL may trap charges. An amount of charges trapped by the charge trap material layer CL may be determined based on the magnitude of the voltage Vt applied to the switching layer SL and duration of the application of the voltage Vt.

The magnitude of the write voltage Vb may vary according to materials, sizes, and shapes of the charge trap material layer CL and the switching layer SL and may be from about 0V to about 10V, for example. While a floating gate-type weighting device demands a write voltage from about 15V to 20V, a weighting device according to the present embodiment may be operate by a relatively low voltage.

Figure 3:
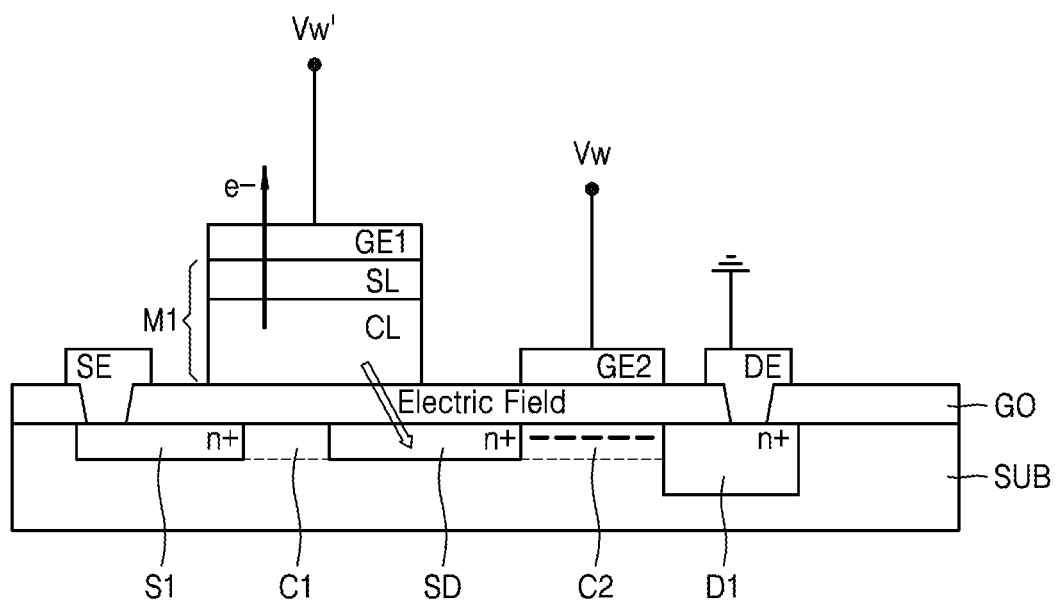
FIG. 3 is a sectional diagram showing an erase operation of the weighting device of FIG. 1.

FIG. 3 is a sectional diagram showing an erase operation of the weighting device of FIG. 1.

Referring to FIG. 3, an erase voltage Vw' is applied to the first gate electrode GE1, the selection voltage Vw is applied to the second gate electrode GE2, and the drain electrode DE may be grounded. The second channel region C2 is opened by the selection voltage Vw, and the erase voltage Vw' may be distributed to the gate insulation layer GO, the charge trap layer M1, and the first gate electrode GE1 of the first transistor TR1. In an erase operation, an electric field is formed between a portion of a surface of the shared region SD and a portion of a surface of the charge trap material layer CL in a direction opposite to the direction in the write operation, where the portion of the surface of the shared region SD and the portion of the surface of the charge trap material layer CL face each other.

When a voltage Vt applied to the switching layer SL is higher than a threshold voltage Vth, the charge trap material layer CL may release charges trapped therein. The magnitude of the erase voltage Vw' may vary according to materials, sizes, and shapes of the charge trap material layer CL and the switching layer SL and may be from about 0V to about 10V, for example. The magnitude of the erase voltage Vw' may be selected to be identical to the magnitude of the write voltage Vb. While a floating gate-type weighting device demands a write voltage from about 15V to 20V, a weighting device according to the present embodiment may be operate by a relatively low voltage.

Figure 4A:
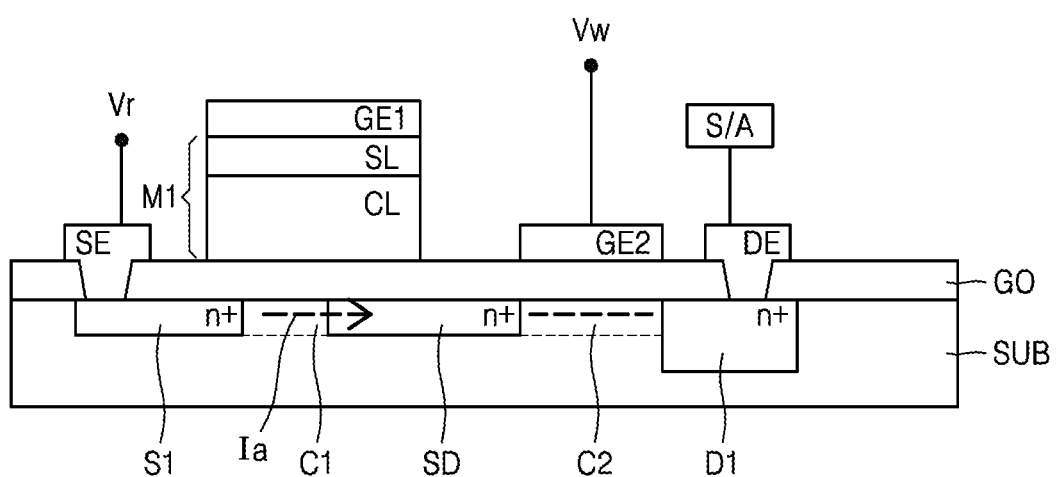
FIGS. 4A through 4C are sectional diagrams showing a read operation of the weighting device of FIG. 1.
Figure 4B:
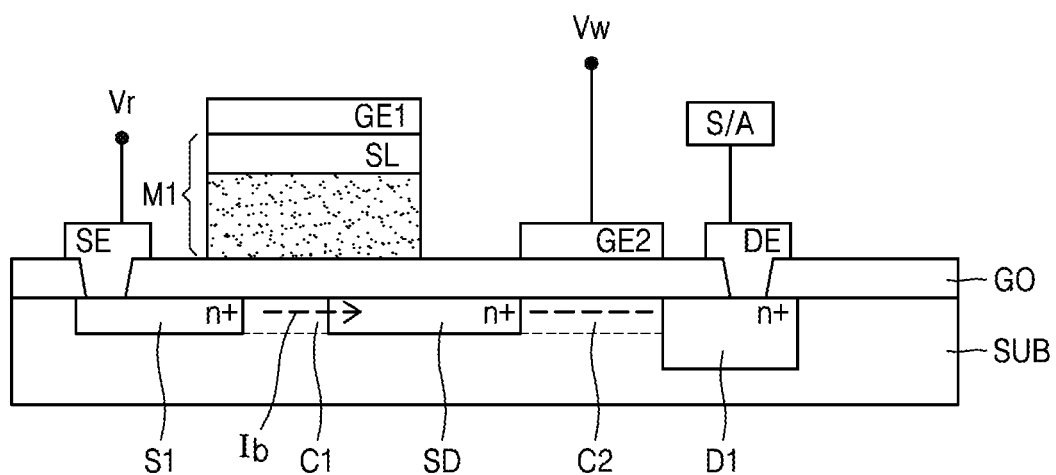
Figure 4C:
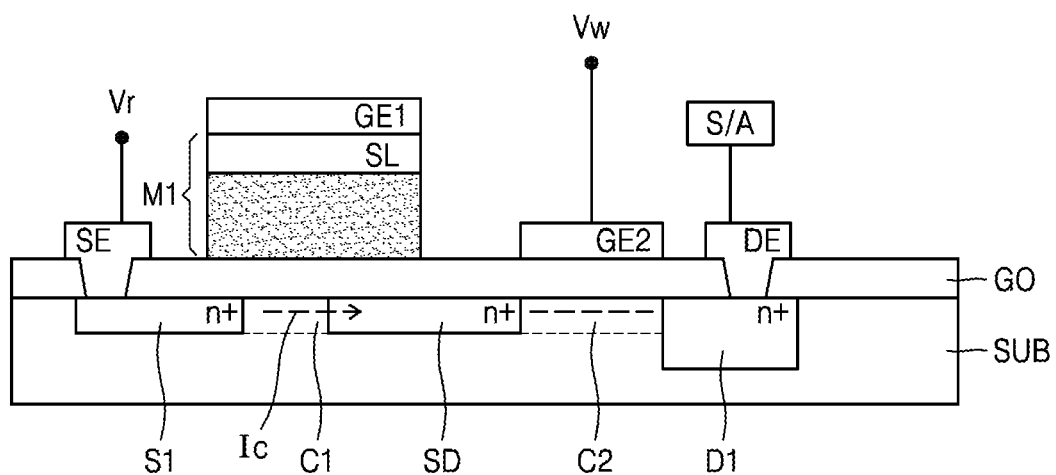

FIGS. 4A through 4C are sectional diagrams showing a read operation of the weighting device of FIG. 1.

As described above, since a first transistor (TR1 of FIG. 1) may be a depletion type transistor, the first channel region C1 may be opened even when no voltage is applied thereto. As more charges are trapped by the charge trap material layer CL, an amount of a current flowing via the first channel region C1 may be reduced. As more charges are trapped by the charge trap material layer CL, the resistance of the first channel region C1 may increase. A read voltage Vr may be applied to the source electrode SE. When a selection voltage Vw is applied to the second gate electrode GE2, the second channel region C2 may be opened.

A sensing current may pass through the first channel region C1 and the second channel region C2 and flow via the drain electrode DE. The sensing current corresponds to an amount of charges trapped by the charge trap material layer CL, where the amount of charges may correspond to a weight value of the weighting device. For example, in FIG. 4A, since no charge is trapped by the charge trap material layer CL, an amount of a sensing current Ia may be relatively large. When such the sensing current Ia is measured, it may be considered that a weight value 2 is stored in the weighting device.

In FIG. 4B, the charge trap material layer CL may be about half-filled with charges and an amount of a sensing current Ib may be smaller than that of the sensing current Ia. When such the sensing current Ib is measured, it may be considered that a weight value 1 is stored in the weighting device.

In FIG. 4C, the charge trap material layer CL may be filled with charges and an amount of a sensing current Ic may be smaller than that of the sensing current Ib. When such the sensing current Ic is measured, it may be considered that a weight value 0 is stored in the weighting device.

The weighting device according to the above embodiment may store multi-level weight values including three levels. However, at least some example embodiments are not limited thereto, and the weighting device may have various multi-level weight values according to volumes and shapes of the charge trap material layer CL. A weight value may be specifically determined based on a sensing current measured by a current indicator or a sensing analyzer connected to the drain electrode DE.

Although a sensing current is measured at the drain electrode DE for determination of a weight in the present embodiment, at least some example embodiments are not limited thereto. For example, since an amount of charges trapped in the charge trap material layer CL may affect an amount of a current transmitted through the first channel region C1, measuring a reference value for quantitatively or qualitatively determining the amount of charges trapped in the charge trap material layer CL may be sufficient. According to the present embodiment, reference values measured for quantitatively determining the amount of charges trapped in the charge trap material layer CL may include an electric current, a voltage, a resistivity, and physical parameters that reflect the characteristics of the first channel region C1.

A specific value of the read voltage Vr may be selected to be lower than those of the write voltage Vb and the erase voltage Vw'. For example, the read voltage Vr may be selected to be from about 0V to about 4V. However, the read voltage Vr is not limited to the above-stated example, where the most efficient value of the read voltage Vr may be selected according to materials, sizes, and shapes of the weighting device.

Figure 5:
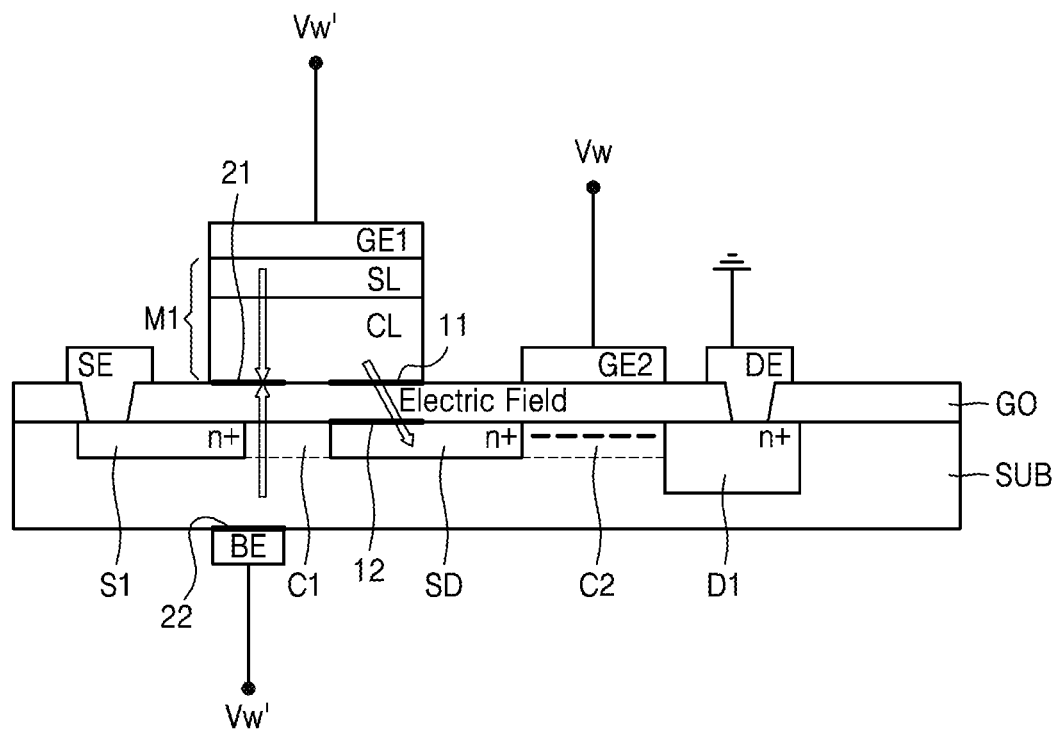
FIG. 5 is a sectional diagram showing a weighting device according to another embodiment.

FIG. 5 is a sectional diagram showing a weighting device according to another embodiment. The weighting device according to the present embodiment is identical to the weighting device according to the embodiment described above with reference to FIGS. 1 through 4 except that a boosting electrode BE is arranged on the rear surface of a substrate of the weighting device according to the present embodiment. Therefore, repeated descriptions will be omitted, and only the boosting electrode BE will be described below.

Referring to FIG. 5, the location of the boosting electrode BE may be over the first channel region C1, apart from a region at which the shared region SD and the charge trap material layer CL partially face each other, and close to the source region S1. The boosting electrode BE and the charge trap material layer CL may face each other. For example, a second upper surface 21 of the charge trap material layer CL, which is a surface of the charge trap material layer CL close to the source region S1, and a second lower surface 22, which is a surface of the substrate SUB contacting the boosting electrode BE, may face each other, may face each other. Referring to FIG. 5, in an erase operation, a boosting voltage Vw' identical to an erase voltage Vw' applied to the first gate electrode GE1 may be applied to the boosting electrode BE arranged at the opposite side of the substrate SUB. For example, the boosting voltage Vw' applied to the boosting electrode BE may be applied to the second lower surface 22 and may offset the erase voltage Vw' applied to the second upper surface 21. This operation mechanism may be referred to as global self-boosting mechanism.

Since the boosting voltage Vw' and the erase voltage Vw' offset each other, a current leakage to the source electrode SE may be prevented. The boosting electrode BE may be located to be sufficiently apart from the shared region SD, such that the boosting voltage Vw' applied to the boosting electrode BE does not affect an electric field near the shared region SD. For example, the second upper surface 21 and the first upper surface 11 may be located to be sufficiently apart from each other. For example, the second lower surface 22 and the first lower surface 12 may be located to be sufficiently apart from each other. Referring to FIG. 5, an electric field between the second upper surface 21 and the second lower surface 22 and an electric field between the first upper surface 11 and the first lower surface 12 may not affect each other.

Figure 6:
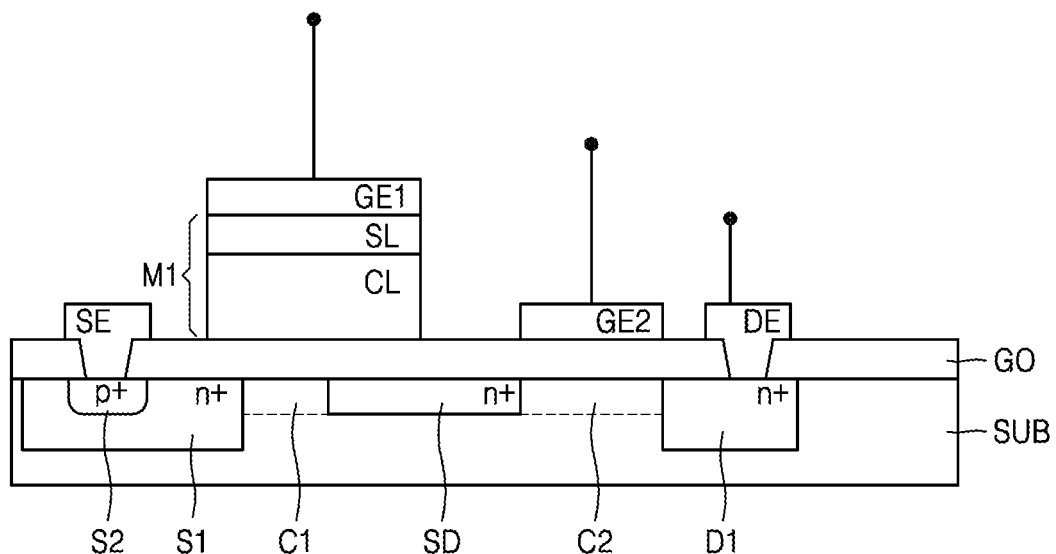
FIG. 6 is a sectional diagram showing a weighting device according to another embodiment.

FIG. 6 is a sectional diagram showing a weighting device according to another embodiment.

The weighting device according to the present embodiment is substantially identical to the weighting device according to the embodiment described above with reference to FIGS. 1 through 4 except that the weighting device according to the present embodiment further includes an anti-leakage region S2. Therefore, repeated descriptions will be omitted, and only the difference therebetween will be described below.

Referring to FIG. 6, the weighting device according to the present embodiment may include the anti-leakage region S2 contacting the source region S1. The anti-leakage region S2 may prevent a current leakage from the first channel region C1 to the source electrode SE. The anti-leakage region S2 may have a conductive type opposite to that of the source region S1. The source electrode SE is arranged on the anti-leakage region S2 and may not directly contact the source region S1. For example, the anti-leakage region S2 may be surrounded by the source region S1 except a surface of the anti-leakage region S2 contacting the source electrode SE.

For example, in an NMOS type weighting device, the source region S1 may have n-type conductive type, and the anti-leakage region S2 may have p-type conductive type. Since the anti-leakage region S2 and the source region S1 constitute a PN diode structure, a leakage current flowing from the first channel region C1 to the source electrode SE may be prevented.

Figure 7:
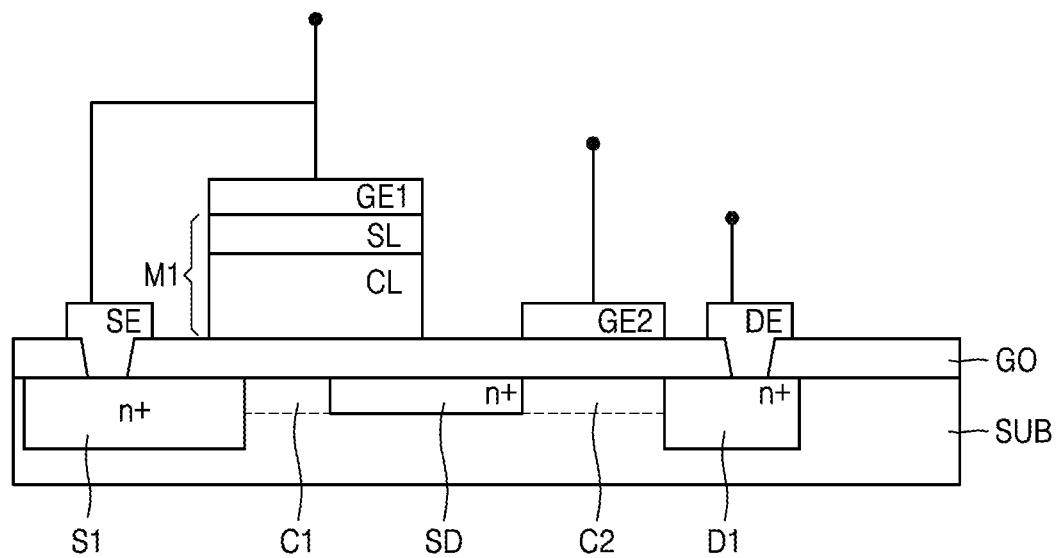
FIG. 7 is a sectional diagram showing a weighting device according to another embodiment.

FIG. 7 is a sectional diagram showing a weighting device according to another embodiment. The weighting device according to the present embodiment may be understood as a weighting device including three terminals. The weighting device according to the present embodiment is substantially identical to the weighting device according to the embodiment described above with reference to FIGS. 1 through 4 except that the first gate electrode GE1 and the source electrode SE of the weighting device according to the present embodiment are electrically connected to each other. Therefore, repeated descriptions will be omitted, and only the difference therebetween will be described below.

Referring to FIG. 7, the first gate electrode GE1 and the source electrode SE may be electrically connected to each other. The source electrode SE and the first gate electrode GE1 of the weighting device according to the present embodiment may function as a single terminal. A neural network consisting of 3-terminal weighting devices may have a size smaller than that of a neural network consisting of 4-terminal weighting devices. The 3-terminal weighting device may be operated in a manner similar to that of the 4-terminal weighting device as described above. Terminals of the 3-terminal includes the first gate electrode GE1 connected to the source electrode SE, the second gate electrode GE2, and the drain electrode DE.

Figure 8:
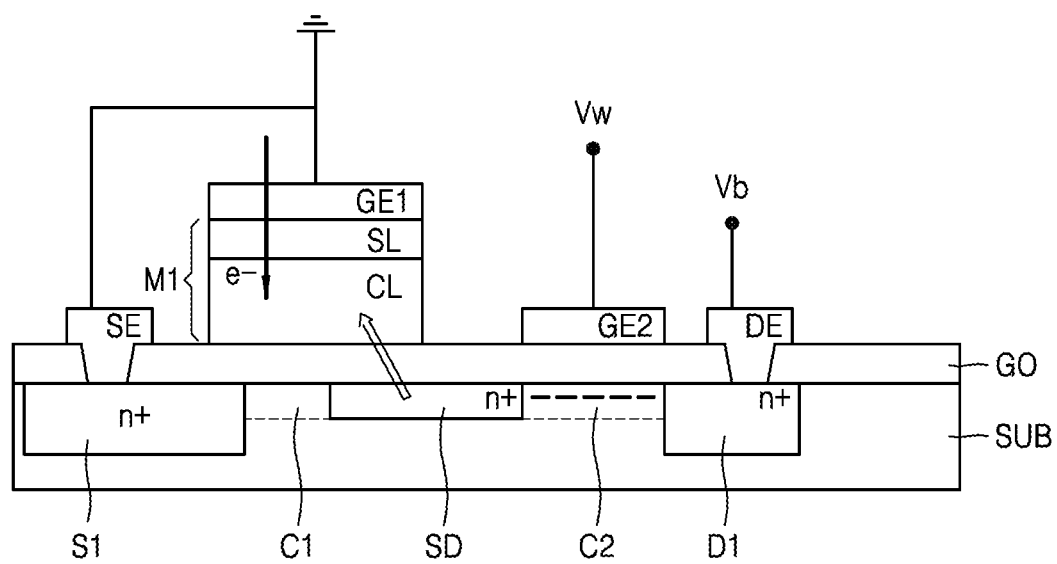
FIG. 8 is a diagram showing a write operation of the weighting device of FIG. 7.

FIG. 8 is a diagram showing a write operation of the weighting device of FIG. 7.

Referring to FIG. 8, a write voltage Vb is applied to the drain electrode DE of the weighting device, a selection voltage Vw is applied to the second gate electrode GE2, and the first gate electrode GE1 may be grounded. The second channel region C2 is opened by the selection voltage Vw, and the write voltage Vb applied to the drain electrode DE may be transmitted to the shared region SD.

Since a surface of the shared region SD partially faces a surface of the charge trap material layer CL, the write voltage Vb transmitted to the shared region SD may contribute to an electric field formed at the charge trap material layer CL. Since the first gate electrode GE1 is grounded, the write voltage Vb may be distributed to the gate insulation layer GO, the charge trap layer M1, and the first gate electrode GE1 of the first transistor TR1. A voltage may be distributed according to resistance value of each layer. The write operation mechanism of the 3-terminal weighting device may be substantially identical to the write operation mechanism of the 4-terminal weighting device.

Figure 9:
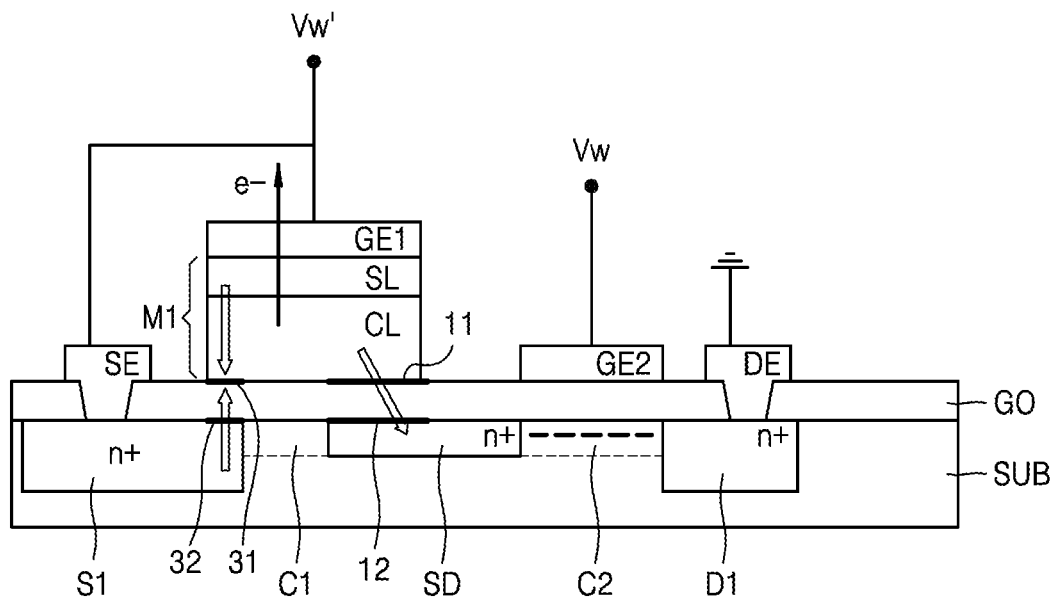
FIG. 9 is a diagram showing an erase operation of the weighting device of FIG. 7.

FIG. 9 is a diagram showing an erase operation of the weighting device of FIG. 7.

Referring to FIG. 9, an erase voltage Vw' is applied to the first gate electrode GE1, a selection voltage Vw is applied to the second gate electrode GE2, and the drain electrode DE may be grounded. The second channel region C2 is opened by the selection voltage Vw, and the erase voltage Vw' may be distributed to the gate insulation layer GO, the charge trap layer M1, and the first gate electrode GE1 of the first transistor TR1. The erase operation mechanism of the 3-terminal weighting device may be substantially identical to the erase operation mechanism of the 4-terminal weighting device.

Furthermore, in the erase operation of the 3-terminal weighting device, the first gate electrode GE1 and the source electrode SE are electrically connected to each other, and thus the erase voltage Vw' may be transmitted to the source region S1. An electric field formed by the erase voltage Vw' transmitted via the source region S1 and an electric field formed by the erase voltage Vw' transmitted to the charge trap layer M1 may offset each other. This operation mechanism of the 3-terminal weighting device may be referred to as intrinsic self-boosting mechanism.

Referring to FIG. 9, the charge trap material layer CL and the source region S1 may face each other across the gate insulation layer GO. For example, a third lower surface 32, which is a surface of the source region S1 close to the first channel region C1, and a third upper surface 31, which is a surface of the charge trap material layer CL closed to the source region S1, may face each other. For example, an erase voltage Vw' may be transmitted to the third upper surface 31, an erase voltage Vw' may be transmitted to the third lower surface 32, where the erase voltages Vw' may offset each other.

Electric fields offset at the source region S1 may be located to be sufficiently apart from an electric field formed between the shared region SD and the charge trap layer M1. Therefore, the offset of the erase voltage Vw' transmitted to the source region S1 and the erase voltage Vw' transmitted to the first gate electrode GE1 may not affect an operation of the weighting device. For example, the third upper surface 31 and the first upper surface 11 may be located to be sufficiently apart from each other. For example, the third lower surface 32 and the first lower surface 12 may be located to be sufficiently apart from each other. Referring to FIG. 9, an electric field between the third upper surface 31 and the third lower surface 32 and an electric field between the first upper surface 11 and the first lower surface 12 may not affect each other.

Unlike a global self-boosting type weighting device, an intrinsic self-boosting type weighting device does not need a separate boosting electrode (BE of FIG. 5). Therefore, an intrinsic self-boosting type weighting device may have a simplified structure as compared to a global self-boosting type weighting device.

A 4-terminal type weighting device may connect the source electrode SE to the first gate electrode GE1 via switching and may operate according to the intrinsic self-boosting mechanism for an erase operation only. In this case, a current leakage to the source electrode SE may be effectively prevented without a separate anti-leakage region (S2 of FIG. 6).

Figure 10A:
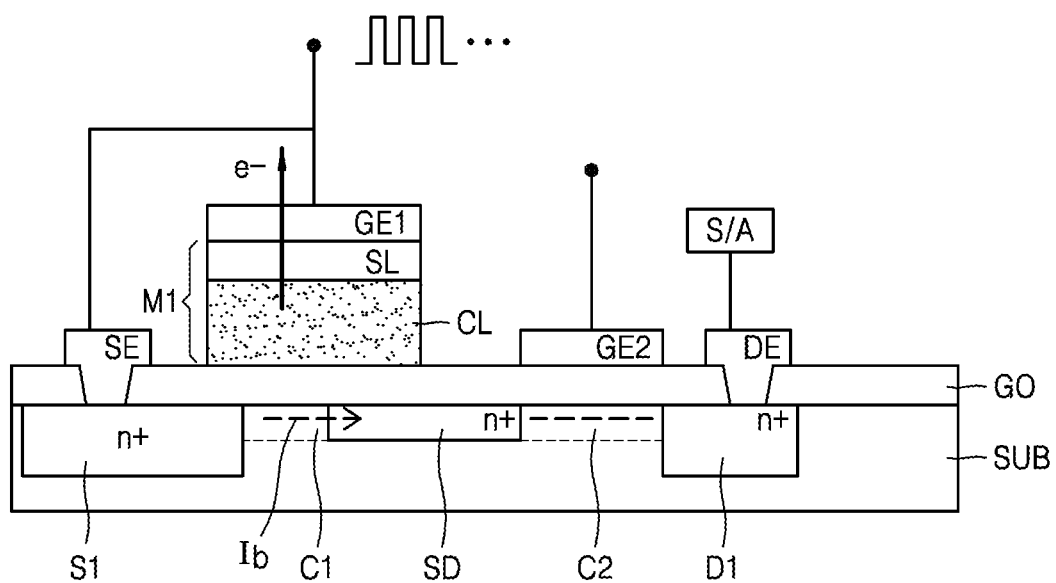
FIGS. 10A and 10B are diagram showing operation methods for controlling a weight of a weighting device.
Figure 10B:
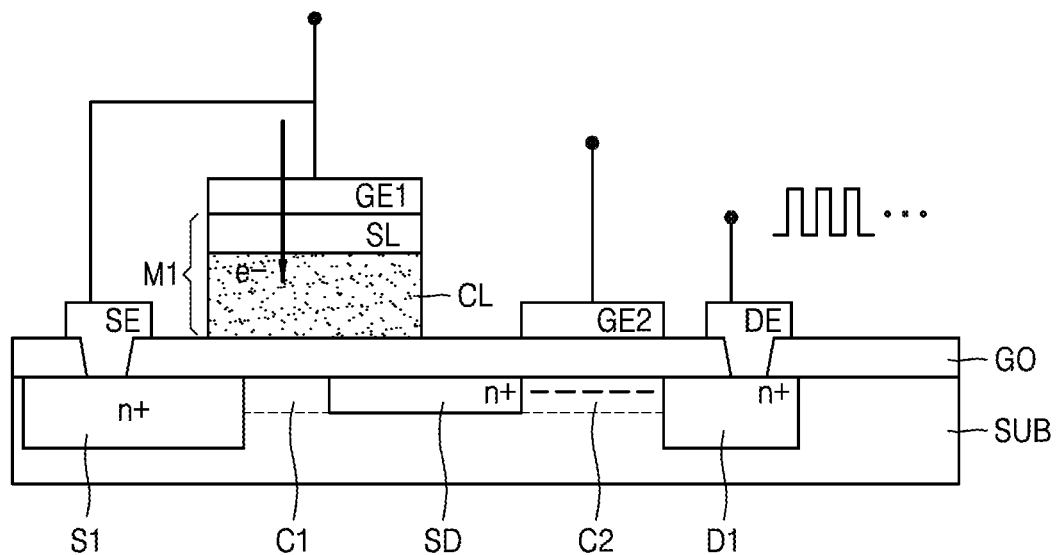

FIGS. 10A and 10B are diagram showing operation methods for controlling a weight of a weighting device. A pulse signal may be applied to a weighting device according to the present embodiment for controlling a weight. A neural network described below may include a plurality of weighting devices and reflect a weight for controlling a function relationship between an input signal and an output signal.

The weighting device according to the present embodiment is substantially identical to the weighting device according to the embodiments described above with reference to FIGS. 7 through 9. Therefore, repeated descriptions of components of the weighting device will be omitted. Furthermore, although the weighting device according to the present embodiment is a 3-terminal weighting device, the weighting device according to the present embodiment is not limited thereto and may include the 4-terminal weighting device as described above.

Referring to FIG. 10A, to increase a weight of the weighting device, a pulse voltage may be applied to the first gate electrode GE1. Except the application of a pulse voltage to the first gate electrode GE1, the operation according to the present embodiment is substantially identical to the write operation of a weighting device described above, and thus repeated descriptions will be omitted. An increment of a weight of a weighting device may be proportional to a number of times that the pulse voltage is applied to the first gate electrode GE1. The magnitude of the pulse voltage may be equal to or higher than that of the write voltage described above. Per-pulse duration of the pulse voltage may vary according to characteristics of a weighting device. For example, per-pulse duration may vary according to materials constituting the switching layer SL. In detail, it may be necessary for per-pulse duration to be sufficiently long to change the resistance state of the switching layer SL.

Referring to FIG. 10B, to reduce a weight of the weighting device, a pulse voltage may be applied to the drain electrode DE. Except the application of a pulse voltage to the drain electrode DE, the operation according to the present embodiment is substantially identical to the erase operation of a weighting device described above, and thus repeated descriptions will be omitted. A reduction of a weight of a weighting device may be proportional to a number of times that pulse voltages are applied to the drain electrode DE. The magnitude of the pulse voltage may be equal to or higher than that of the write voltage described above. As described above, per-pulse duration of the pulse voltage may vary according to characteristics of a weighting device.

Figure 11:
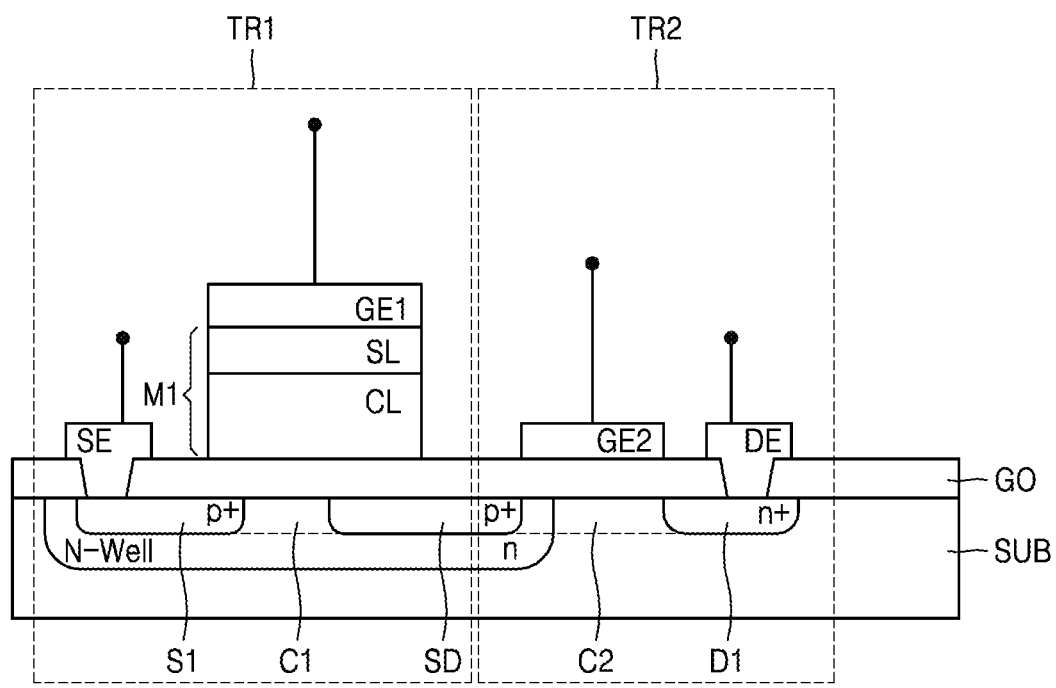
FIG. 11 is a sectional diagram showing a weighting device according to another embodiment.

FIG. 11 is a sectional diagram showing a weighting device according to another embodiment. Referring to FIG. 11, the first channel region C1 and the second channel region C2 of the substrate SUB may have different conductive types from each other. The structures of the first transistor TR1 and the second transistor TR2 other than the first channel region C1 and the second channel region C2 are identical to those described above with reference to FIGS. 1 through 4, repeated descriptions will be omitted.

In the weighting device according to the present embodiment, the first transistor TR1 may be a PMOS transistor located over the first channel region C1 having n-type conductive type, whereas the second transistor TR2 may be an NMOS transistor located over the second channel region C2 having p-type conductive type. For example, the first transistor TR1 may be a PMOS arranged on an N-well doped with an n-type dopant, whereas the second transistor TR2 may be an NMOS arranged on a P-well doped with a p-type dopant.

For example, the source region S1 and the shared region SD may be arranged inside an N-well and include a p-type dopant. Therefore, since the source region S1 and the N-well surrounding the source region S1 have conductive types opposite to each other, the source region S1 and the N-well may constitute a PN diode structure. The weighting device according to the present embodiment may prevent a current backflow from the first channel region C1 to the source electrode SE. However, the embodiment is merely an example, and at least some example embodiments are not limited thereto. For example, the first transistor TR1 may be an NMOS arranged on a well doped with a p-type dopant, and the second transistor TR2 may be a PMOS arranged on the substrate SUB doped with an n-type dopant. Alternatively, the first transistor TR1 may be arranged on the substrate SUB, and the second transistor TR2 may be arranged on a well.

Figure 12:
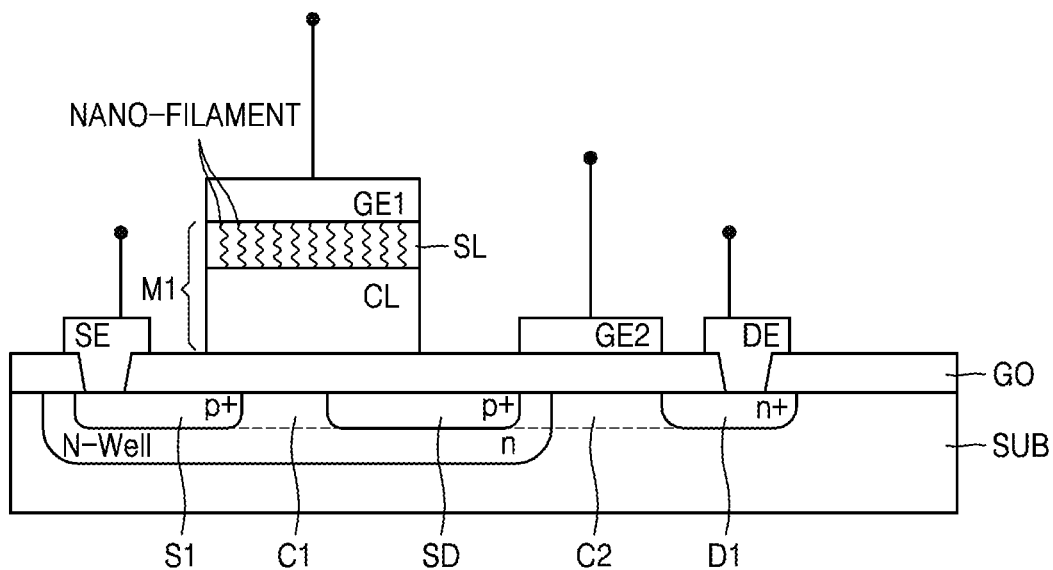
FIG. 12 is a sectional diagram showing a weighting device according to another embodiment.

FIG. 12 is a sectional diagram showing a weighting device according to another embodiment. Since the weighting device according to the present embodiment is substantially identical to the weighting device of FIG. 11 except a material constituting the switching layer SL, repeated descriptions will be omitted. Referring to FIG. 12, the switching layer SL may include a nano-filamentary material that exhibits a low resistance state due to nano-filaments.

The nano-filamentary material may be a material in which conductive nano-filaments are formed when a voltage equal to or higher than a particular voltage unique to the material. A nano-filament may refer to a conductive path formed by a voltage. When a voltage lower than the particular voltage is applied to the nano-filamentary material, no nano-filament is formed, and thus it may be relatively difficult for a current to flow therethrough.

The nano-filamentary material may include a nano-filament, e.g., $TiO_x$. For example, when a voltage is applied to the nano-filamentary material, $TiO_x$ therein may form nano-filaments and form a low resistance state. The number and shape of nano-filaments may be different in one nano-filamentary material than another based on voltages applied to the nano-filamentary material. Therefore, the resistance behavior of a nano-filamentary material may vary. When the switching layer SL includes a nano-filamentary material, the switching layer SL may exhibit a very short resistance switching time in nanoseconds.

Figure 13:
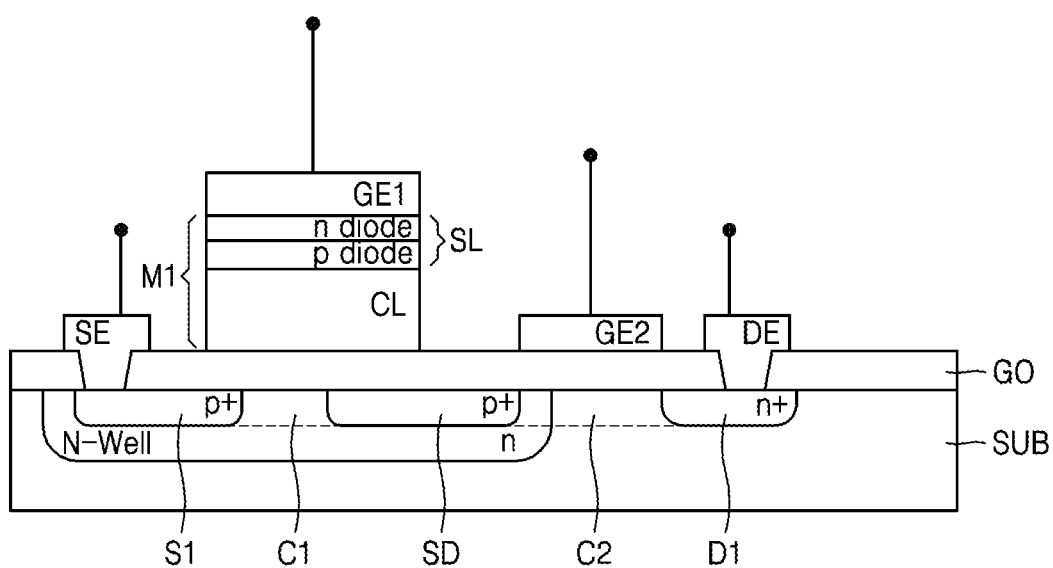
FIG. 13 is a sectional diagram showing a weighting device according to another embodiment.
Figure 14:
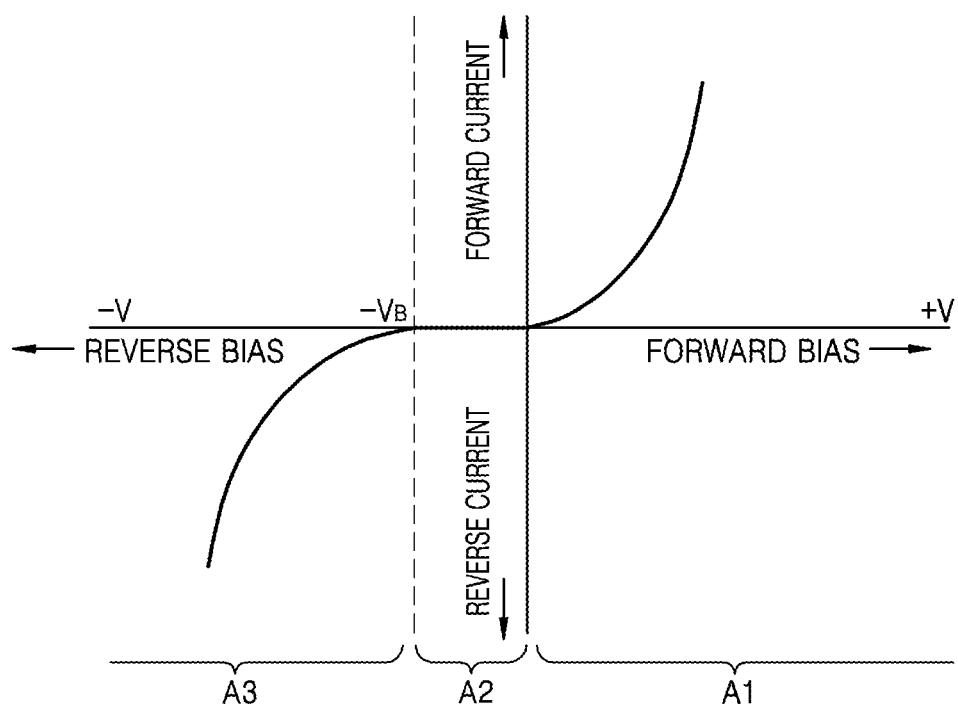
FIG. 14 is a diagram showing a curve of current versus voltage applied to the PN diode layer of FIG. 13.

FIG. 13 is a sectional diagram showing a weighting device according to another embodiment. FIG. 14 is a diagram showing a curve indicating current versus voltage applied to the PN diode layer of FIG. 13.

Referring to FIG. 13, the switching layer SL may include a PN diode layer including a P-type diode layer and an N-type diode layer. The weighting device according to the present embodiment is substantially identical to the weighting device of FIG. 11 except a material constituting the switching layer SL, and thus repeated descriptions will be omitted. The PN diode layer may include a combination of the above-stated threshold voltage changing materials. The PN diode layer may ease charging of the charge trap layer M1 and effectively prevent discharging of the charge trap layer M1. Compared to the switching layer SL of the above-stated embodiments, the PN diode layer may apply a write voltage less than an erase voltage, thereby being possible to save power.

Referring to FIG. 14, in the curve indicating current versus voltage applied to the PN diode layer, a positive bias voltage region A1 denotes a low resistance region in which a current may flow even when a weak voltage is applied thereto, a negative bias voltage region A2 denotes a high resistance region in which no current flows even when a voltage is applied thereto, and a breakdown voltage region A3 denotes a low resistance region in which a current may flow as a resistance thereof is lowered due to breakdown of a high resistance caused by a reverse bias voltage of a diode exceeding a limit. A boundary voltage between the negative bias voltage region A2 and the breakdown voltage region A3 may be referred to as a breakdown voltage.

An operation of the PN diode layer of the weighting device according to the present embodiment will be described below with reference to FIG. 14. Descriptions identical to those in the above methods of operating a weighting device will be briefly presented.

In a write operation of the weighting device according to the present embodiment, a write voltage may be applied via the drain electrode DE, where a positive bias voltage may be distributed to the PN diode layer. Since the PN diode layer is located in the positive bias voltage region Al of FIG. 14, the charge trap material layer CL may trap charges.

In an erase operation of the weighting device according to the present embodiment, an erase voltage may be applied via the first gate electrode GE1, where a negative bias voltage may be distributed to the PN diode layer. The PN diode layer may be located at the negative bias voltage region A2 or the breakdown voltage region A3 of FIG. 14. When the magnitude of the voltage applied to the PN diode layer is equal to or higher than that of a breakdown voltage, the PN diode layer may be located at the breakdown voltage region A3, and the charge trap material layer CL may release charges. When the magnitude of the voltage applied to the PN diode layer is lower than that of the breakdown voltage, the PN diode layer may be located at the negative bias voltage region A2, and the PN diode layer may not release charges.

Figure 15A:
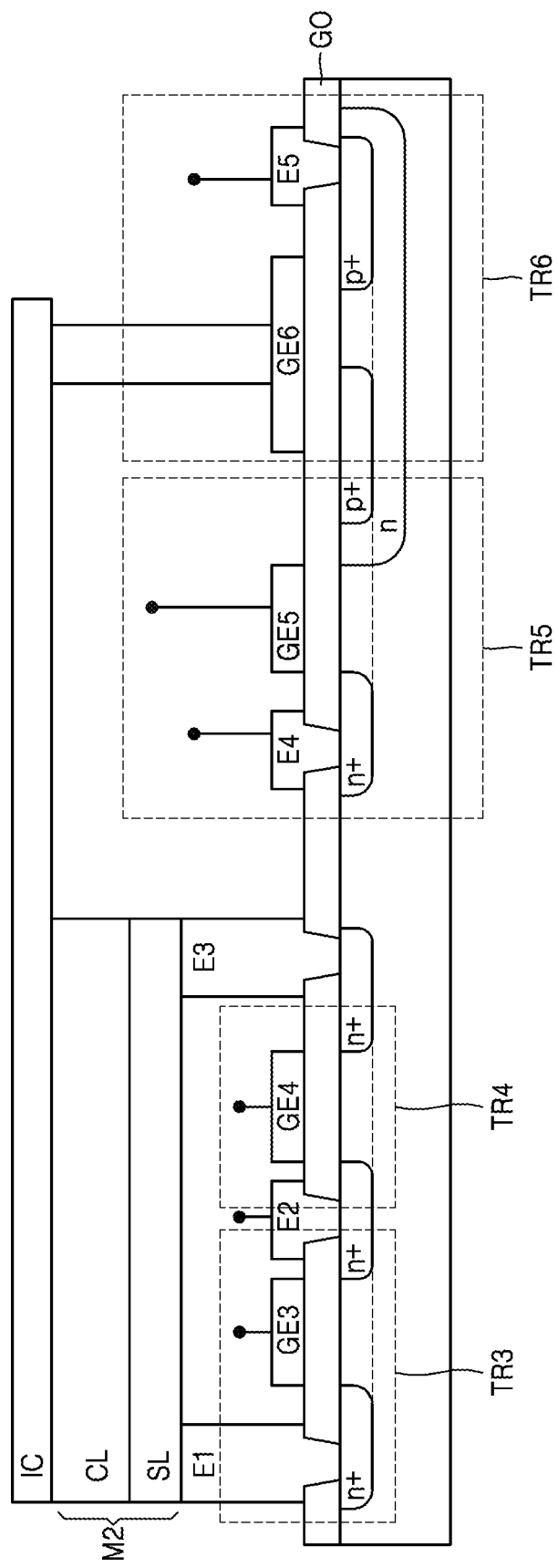
FIGS. 15A through 15D are schematic sectional diagrams showing a weighting device according to another embodiment and a method of operating the same.

FIGS. 15A through 15D are schematic sectional diagrams showing a weighting device according to another embodiment and a method of operating the same. Referring to FIG. 15A, the weighting device according to the present embodiment may be a 6-terminal weighting device including four transistors TR3, TR4, TR5, and TR6.

The weighting device according to the present embodiment may include a third transistor TR3 that includes a third gate electrode GE3, a first electrode El, and a second electrode E2, a fourth transistor TR4 that shares the second electrode E2 with the third transistor TR3 and includes a fourth gate electrode GE4 and a third electrode E3, a fifth transistor TR5 that includes a fifth gate electrode GE5 and a fourth electrode E4, and a sixth transistor TR6 that includes a sixth gate electrode GE6 and a fifth electrode E5.

The third transistor TR3, the fourth transistor TR4, the fifth transistor TR5, and the sixth transistor TR6 are named to be distinguished from a first transistor (TR1 of FIG. 1) and a second transistor (TR2 of FIG. 1) of the above-stated embodiments.

The third transistor TR3 may use a first shared region SD1 as a drain, whereas the fourth transistor TR4 may use the first shared region SD1 as a source. The fifth transistor TR5 may use a second shared region SD2 as a drain, whereas the sixth transistor TR6 may use the second shared region SD2 as a source.

The weighting device according to the present embodiment may include a charge trap layer M2 electrically connected to the first electrode E1 and the third electrode E3. The weighting device according to the present embodiment may include an interconnect IC that interconnects the charge trap layer M2 and the sixth gate electrode GE6. Terminals for controlling operations of the weighting device according to the present embodiment may include six electrodes, that is, the third gate electrode GE3, the second electrode E2, the fourth gate electrode GE4, the fourth electrode E4, the fifth gate electrode GE5, and the fifth electrode E5.

In the weighting device according to the present embodiment, the charge trap layer M2 may be arranged on the first electrode E1 and the third electrode E3. In the weighting device according to the above-stated embodiments, a charge trap layer (M1 of FIG. 1) is arranged on a first channel region (C1 of FIG. 1) of a transistor, and thus the cross-sectional area of the charge trap layer (M1 of FIG. 1) may be restricted by the area of the first channel region (C1 of FIG. 1). Since the volume of the charge trap layer M2 may determine the size of multi-level (e.g., an amount of distinct charge levels) as described above, it may be necessary for the charge trap layer M2 to have a sufficiently large size, such that the weighting device has a large multi-level including dozens of charge levels. Therefore, the charge trap layer M2 may be arranged on the first electrode E1 and the third electrode E3 to have a sufficient cross-sectional area without being restricted by the area of the first channel region (C1 of FIG. 1).

Figure 15B:
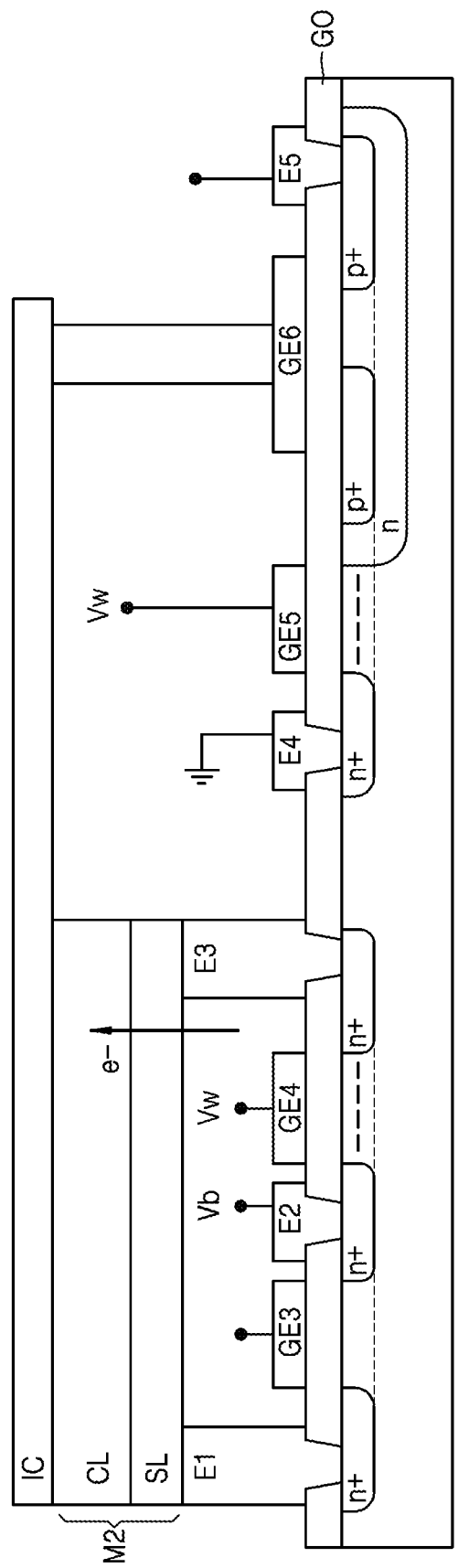

Referring to FIG. 15B, a write operation of the weighting device according to the present embodiment will be described.

A write voltage Vb may be applied to the second electrode E2, where a selection voltage Vw may be applied to either one of the third gate electrode GE3 or the fourth gate electrode GE4. The fourth electrode E4 may be grounded, where the selection voltage Vw may be applied to the fifth gate electrode GE5. As described above, the write voltage Vb may be distributed to the switching layer SL and charge trap material layer CL. For example, when the switching layer SL includes a PN diode layer, the charge trap material layer CL may trap charges transmitted through the PN diode layer even if a small voltage is applied to the switching layer SL. For example, when the switching layer SL includes one of the above materials other than the PN diode layer, the charge trap material layer CL may trap charges only when a voltage equal to or higher than a threshold voltage is applied to the switching layer SL to switch the resistance state of the switching layer SL.

Figure 15C:
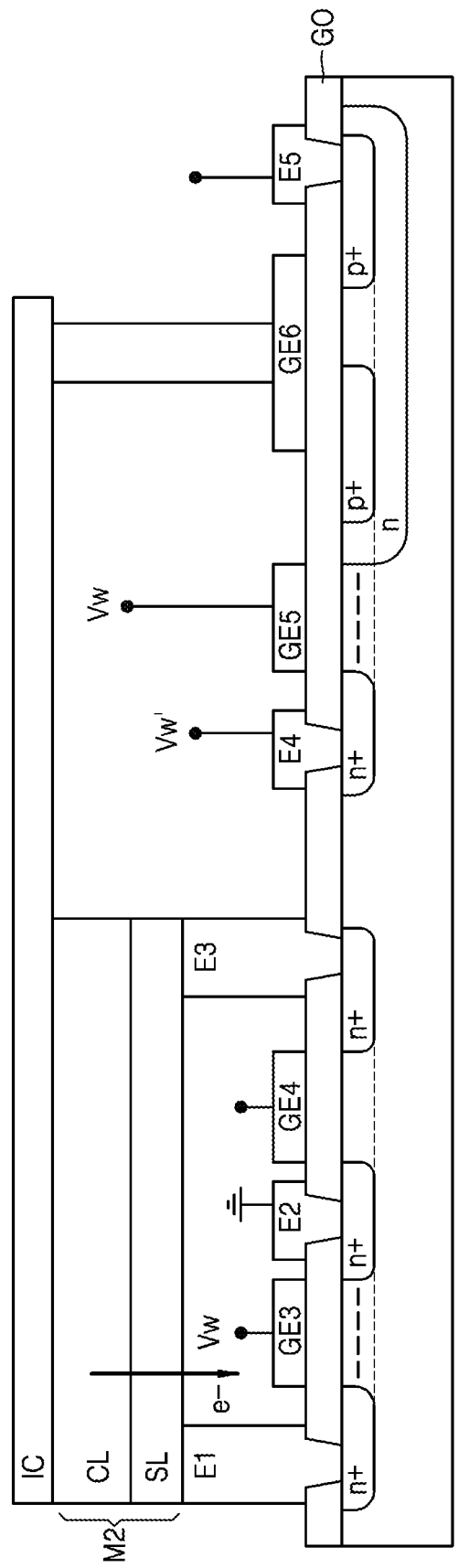

Referring to FIG. 15C, an erase operation of the weighting device according to the present embodiment will be described. The second electrode E2 may be grounded, and a selection voltage Vw may be applied to either one of the third gate electrode GE3 or the fourth gate electrode GE4. An erase voltage Vw' may be applied to the fourth electrode E4, whereas the selection voltage Vw may be applied to the fifth electrode E5. When a voltage applied to the switching layer SL exceeds a threshold voltage, charges trapped by the charge trap material layer CL may be released to the first electrode E1 or the third electrode E3. For example, when the switching layer SL includes a PN diode layer, the charge trap material layer CL may release charges only when a voltage equal to or higher than a breakdown voltage is applied to the switching layer SL. For example, when the switching layer SL includes one of the above materials other than the PN diode layer, the charge trap material layer CL may release charges only when a voltage equal to or higher than a threshold voltage is applied to the switching layer SL to switch the resistance state of the switching layer SL.

Figure 15D:
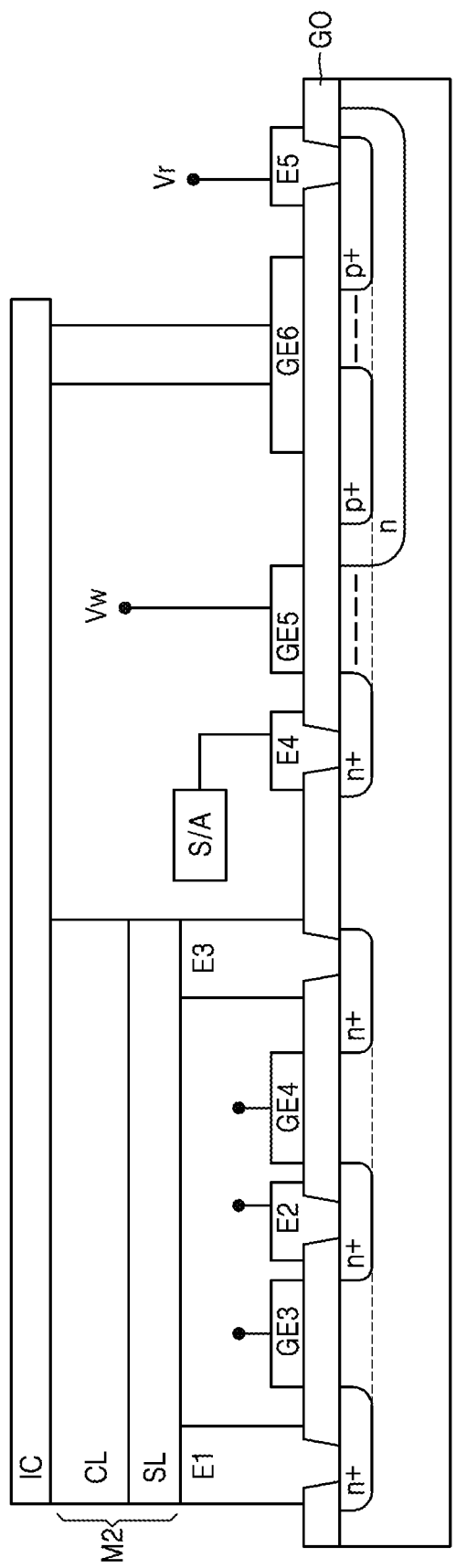

Referring to FIG. 15D, a read operation of the weighting device according to the present embodiment will be described.

A read voltage Vr may be applied to the fifth electrode E5, and a selection voltage Vw may be applied to the fifth gate electrode GE5. As described above, a weight value may be read out by measuring the intensity of a current flowing toward the fourth electrode E4. No voltage may be applied to a third transistor (TR3 of FIG. 15A) and a fourth transistor (TR4 of FIG. 15A).

Figure 16:
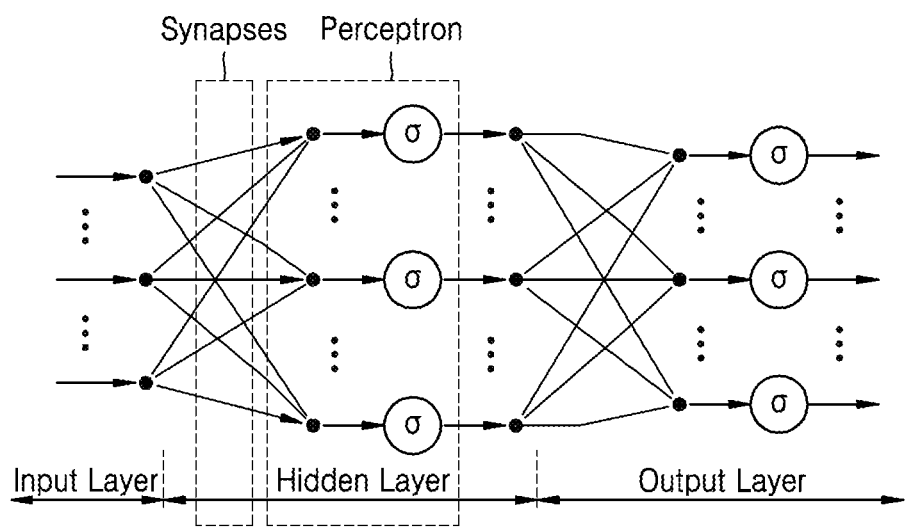
FIG. 16 is a schematic diagram showing the principle of a neural network.

FIG. 16 is a schematic diagram showing the principle of a neural network. A neural network may include at least one column of hidden layers between an input layer and an output layer. Input information may be input to the input layer as an electric signal, whereas output information may be output from the output layer as an electric signal. A hidden layer may be a black box-like element (e.g., an element that produces specific outputs based on specific inputs, for example, by applying a function to the specific inputs) for determining a correlation between input information and output information. A hidden layer may embody not only a linear function relationship, but also a non-linear function relationship. A hidden layer may include a plurality of weighting devices as described above. A non-linear function relationship embodied by a hidden layer may be determined based on weight values of the plurality of weighting devices included in the hidden layer.

A hidden layer may include a plurality of columns. The more columns the hidden layer includes, the more complex non-linear function relationship the hidden layer may embody. A neural network including a plurality of hidden layers may be used for deep learning. The deep learning may refer to a highly non-linear learning method.

A hidden layer may include a synapse and a perceptron. A synapse may refer to a connection relationship between neurons shown as dots. A perceptron may be a component of a neural network for embodying a function relationship by applying a weight to information transmitted via synapses. In other words, the above-stated weighting device may correspond to a perceptron. Since a plurality of transistors included in an input layer correspond to neurons of an actual neural network, the transistors will be hereinafter referred to as neuron transistors.

Figure 17A:
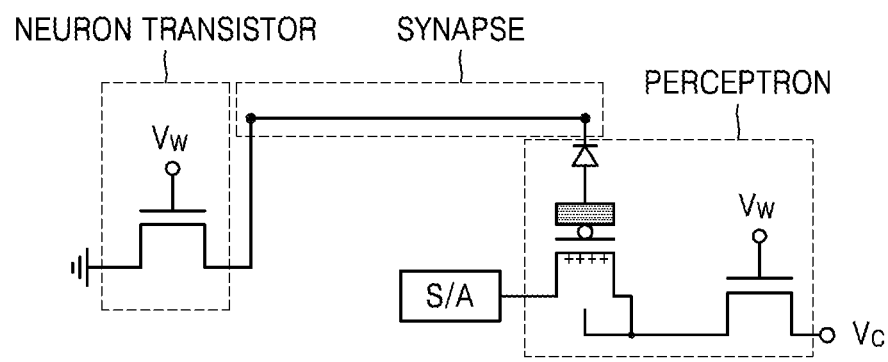
FIGS. 17A through 17C are schematic diagrams showing a method of operating a weighting device on a neural network.
Figure 17B:
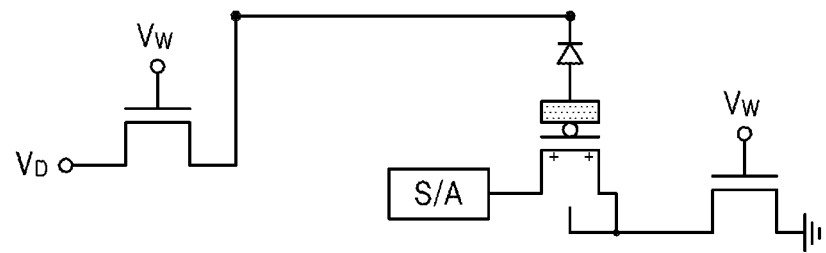
Figure 17C:
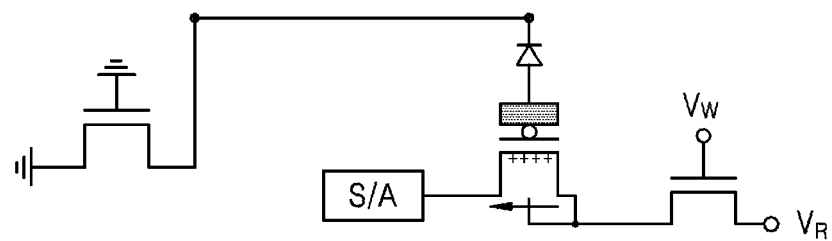

FIGS. 17A through 17C are schematic diagrams showing a method of operating a weighting device on a neural network. The neural network according to the present embodiment may include a neuron transistor and a perceptron consisting of one weighting device. A synapse may correspond to a connection relationship between a drain of the neuron transistor and a gate electrode of the weighting device. For example, the neuron transistor may selectively switch a gate voltage applied to the weighting device. It is necessary to activate a synapse for the neuron transistor and the weighting device to exchange an electric signal, where the activation of the synapse may correspond to activation of a channel region of the neuron transistor and activation of a channel region of the weighting device. FIG. 17A is a diagram showing a method of increasing a weight, FIG. 17B is a diagram showing a method of reducing a weight, and FIG. 17C is a diagram showing a method of reading a weight.

Referring to FIGS. 17A and 17B, the synapse interconnecting the neuron transistor and the perceptron may be activated by applying selection voltages Vw to the neuron transistor and the weighting device. Since methods of increasing and reducing a weight of the corresponding perceptron thereafter are substantially identical to the above-stated operations of the weighting device, detailed descriptions thereof will be omitted.

Referring to FIG. 17C, a weight value of the perceptron may be checked. Since it is not necessary to activate the synapse interconnecting the neuron transistor and the perceptron, the selection voltage Vw may not be applied to the neuron transistor and may be applied only to the weighting device.

Figure 18A:
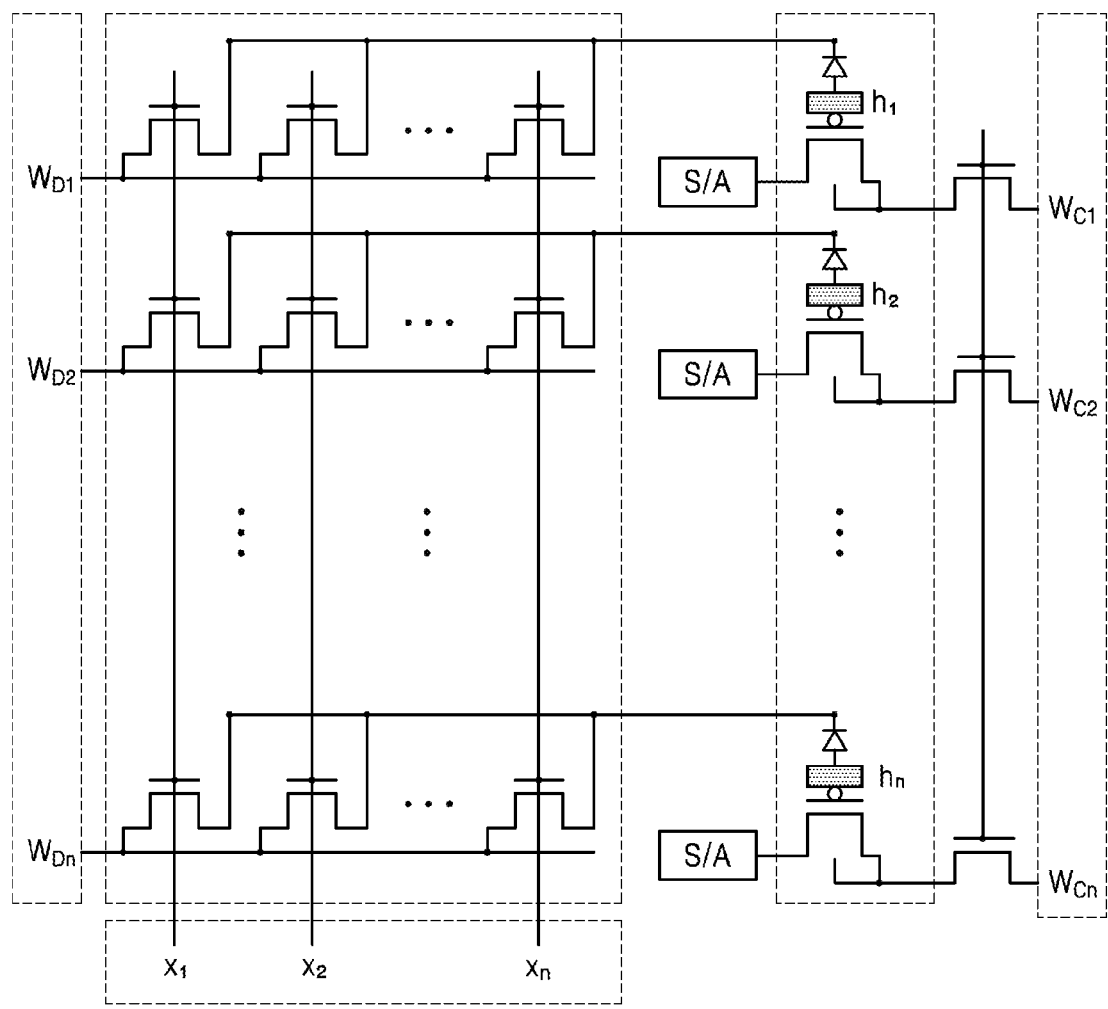
FIGS. 18A through 18C are schematic diagrams showing operations of a neural network including a plurality of columns of neuron transistors and a single column of perceptrons.
Figure 18B:
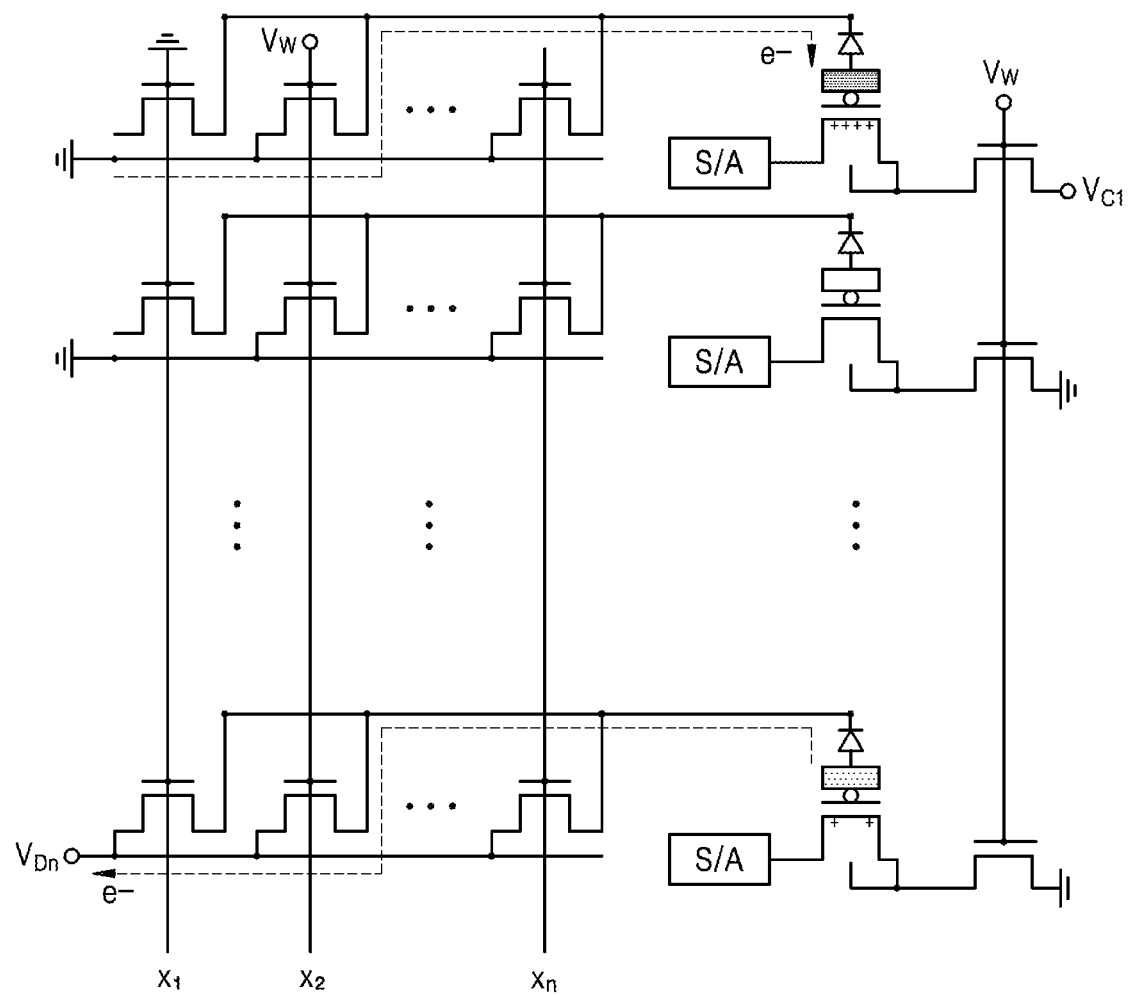
Figure 18C:
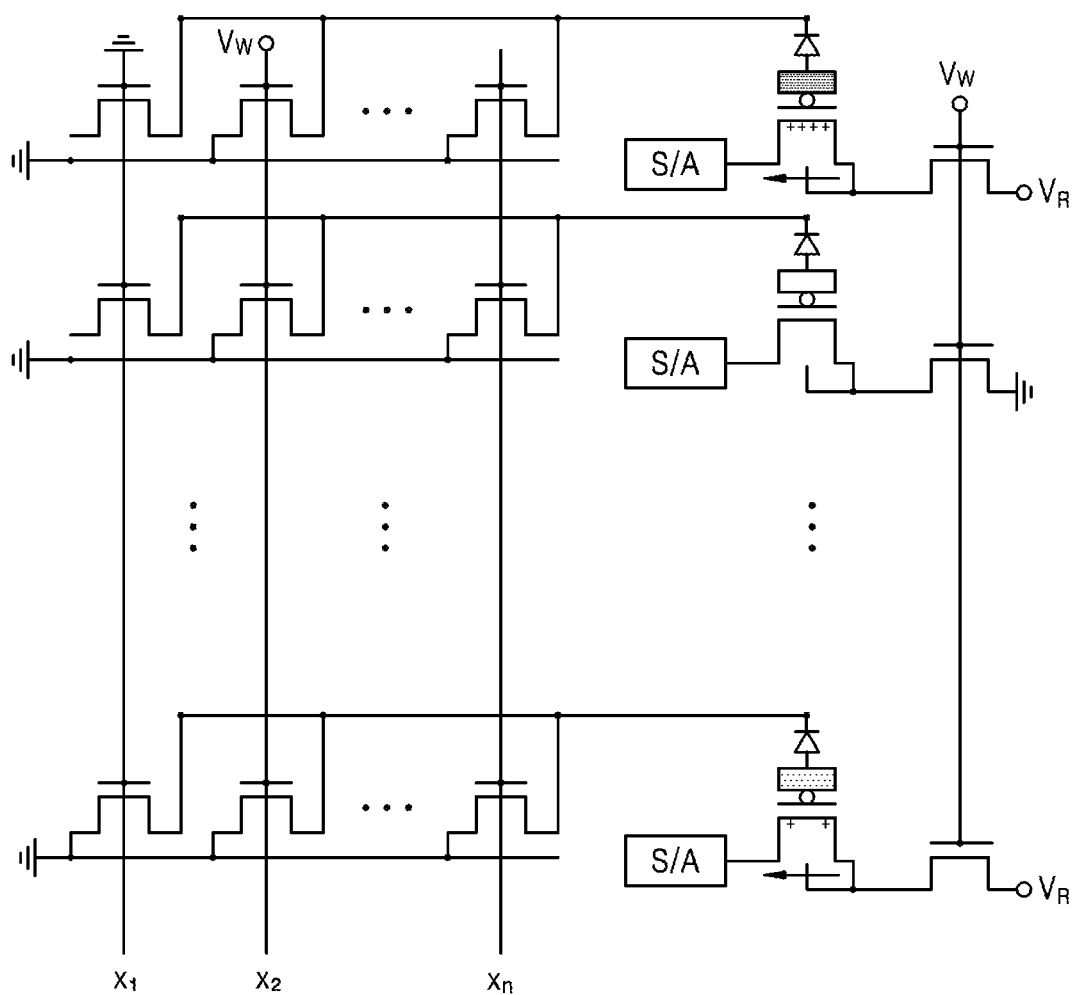

FIGS. 18A through 18C are schematic diagrams showing operations of a neural network including a plurality of columns of neuron transistors and a single column of perceptrons.

Referring to FIG. 18A, a plurality of neuron transistors may be arranged 2-dimensionally in a (a*b) arrangement. In the 2-dimensional arrangement of (a*b), a may be a number indicating a row, and b may be a number indicating a column. For example, in the case of a transistor located in the topmost row of the neural network, the transistor is located in the first row, and thus, the transistor may be indicated via a=1. Also, a transistor located in the row below may be indicated via a=2. For example, in the case of a transistor located in the leftmost column of the neural network, the transistor is located in the first column, and thus, the transistor may be indicated via b=1. Also, a transistor located in the next column may be indicated as b=2. For example, a transistor at a location (1*1) may refer to a neuron transistor located at the first column of the first row from the upper-left corner of the neural network.

Neuron transistors according to the present embodiment may be 2-dimensionally arranged in an (n*n) arrangement. In other words, n transistors may be arranged along each row and n transistors may be arranged along each column. However, the embodiment is merely for convenience of explanation, and at least some example embodiments are not limited thereto.

Source electrodes of neuron transistors located in same row may be connected to one another and constitute an input line. Referring to FIG. 18A, to distinguish input lines of respective rows, the input lines may be denoted as WD1 through $W_{Dn}$. An input signal may be applied to an input line.

Gate electrodes of neuron transistors located in same column may be connected to one another and constitute a select line. Referring to FIG. 18A, to distinguish select lines of respective columns, the select lines may be denoted as $x_1$ through $x_n$. A select voltage may be applied to a select line. When a select voltage is applied to a particular select line, all of transistors of a corresponding column may be selected. For example, channel regions of the selected transistors of the corresponding column may be opened.

A perceptron may include a plurality of weighting devices according to above-stated embodiments.

Referring to FIG. 18A, when neuron transistors are arranged 2-dimensionally in a (n*n) arrangement, weighting devices may be 1-dimensionally arranged in a perceptron. For example, drain electrodes of neuron transistor located at a same row may be electrically connected to a first gate electrode of a weighting device located at the same row and constitute a synapse. As described above, a drain electrode of each weighting device may control a weight of the weighting device by applying a write voltage. Drain electrodes of weighting devices may be indicated as input lines $W_{C1}$ through $W_{CN}$, respectively.

Second gate electrodes of weighting devices constituting a perceptron may be connected to one another and constitute a select line. Referring to FIG. 18A, a select line of the perceptron may be indicated as y1. When a selection voltage Vw is applied to the select line y1, all of weighting devices of a corresponding column may be selected. For example, second channel regions C2 of the selected weighting devices may be opened. Since detailed descriptions thereof are given above, the descriptions will not be repeated.

The neural network may control voltages applied to the input lines $W_{D1}$ through $W_{Dn}$, the select lines $x_1$ through $x_n$, the input lines $W_{C1}$ through $W_{CN}$, and the select line y1, thereby controlling weights h1 through hn of the respective weighting devices included in the perceptron.

Referring to FIG. 18B, a write operation and an erase operation of the neural network will be described. For example, a selection voltage Vw may be applied to the select line x2 and may not be applied to the select lines x1 through x3 and xn. Therefore, neuron transistor located at the second column may be selected. Since a selection voltage Vw is applied to the select line y1, a weighting device connected to the select line y1 may be activated. Therefore, a synapse between neuron transistors located on the select line x2 and weighting devices located on the select line y1 may be activated. For example, an input line write voltage Vc1 may be applied to the input line $W_{C1}$, whereas the input line $W_{D1}$ may be grounded. Charges may be introduced via a synapse between a neuron transistor located at a location (1*2) and a weighting device located at the first row, and thus the weight h1 may be increased. For example, the input line $W_{Cn}$ may be grounded, whereas an erase voltage $V_{Dn}$ may be applied to the input line $W_{Dn}$. Charges may be leaked via a synapse between a neuron transistor located at a location (n*2) and a weighting device located at the $n^{th}$ row, and thus the weight hn may be reduced.

As described above, the write voltage and the erase voltage may be pulse voltages.

Referring to FIG. 18C, a read operation of the neural network will be described. For example, a read voltage $V_R$ may be applied to the input line $W_{C1}$. The weight h1 may be read by measuring a sensing current flowing via a weighting device located at the first row. For example, the read voltage $V_R$ may be applied to the input line $W_{Cn}$, and thus the weight hn may be read. As described above, the weight of a corresponding weighting device may be read from a sensing current measured by a current indicator or a sensing analyzer (S/A). Since the reading of the weights h1 through hn may not be related to activation of synapse with a neuron transistor, no select voltage may be applied to the select lines $x_1$ through $x_n$.

Although the single column of perceptrons are arranged in the neural network shown in FIGS. 18A through 18C, at least some example embodiments are not limited thereto. A neural network may include perceptrons arranged in a plurality of columns, where such a neural network may be used for deep learning as described above.

Figure 19:
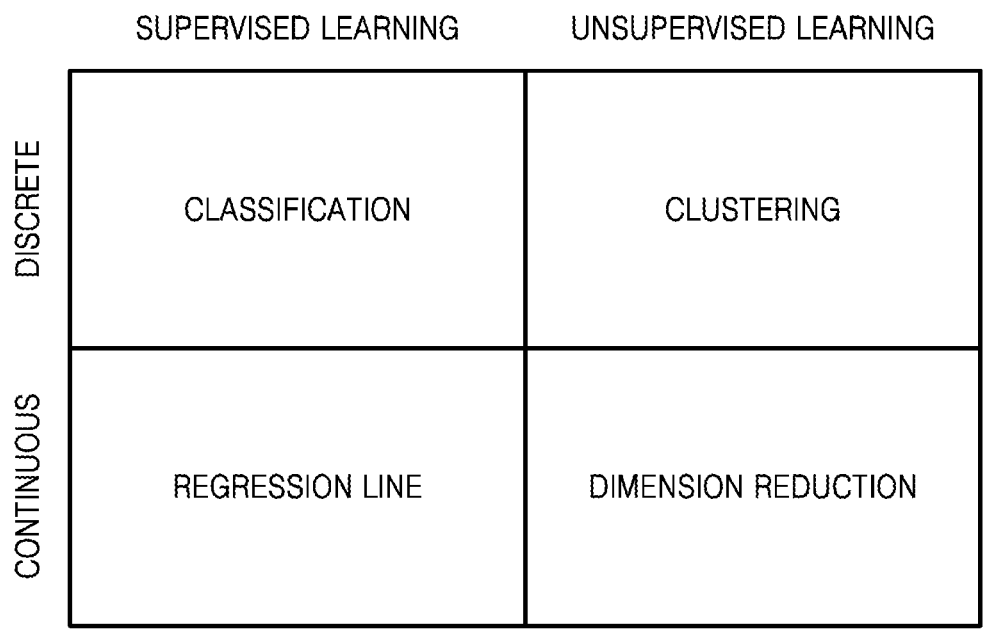
FIG. 19 is a diagram about learning by using a neural network.

FIG. 19 is a diagram related to learning using a neural network. A neural network may be used for continuous learning and discrete learning. The discrete learning learning may comprise a classification and a clustering. The continuous learning may comprise a regression line and dimension reduction. Since, according to at least some example embodiments, a neural network using the above-stated weighting device is a network using a limited number of weighting devices, according to at least some example embodiments, the neural network may be used for discrete learning.

A neural network including a non-volatile weighting device may be used for supervised learning and unsupervised learning. The supervised learning is a machine learning method for inferring a particular function from training data. The training data refers to set input information and set output information. Generally, input information is included as vectors, where particular output information is set with respect to each input information vector. Supervised learning is training a neural network to output particular output information in response to such input information. According to at least some example embodiments, a neural network may be trained by adjusting a weight. Classification refers to a type of a given input vector determined by using a trained neural network.

Figure 20:
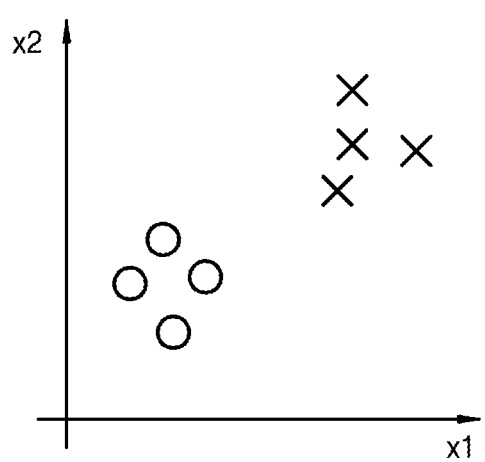
FIG. 20 is a graph about supervised learning.

Referring to FIG. 20, a classification may be determined based on a relationship between an output x2 and an input x1 in a neural network trained in supervised learning. For example, a classification may be determined by arranging a neural network that is trained in supervised learning for outputting an output value B with respect to an input value A, inputting unknown input values C and D to the neural network, and determining whether output values corresponding to the unknown input values C and D correspond to the output value B. Referring to FIG. 20, input values corresponding to the output value B are indicated by circles, whereas input values not corresponding to the output value B are indicated by crosses. The values indicated by circles and crosses are values classified based on whether the values are data for a neural network trained in supervised learning.

The unsupervised learning is a machine learning method in which no target value of output information regarding an input value is given, unlike the above-stated supervised learning. Clustering is an example of unsupervised learning. Clustering refers to statistically analyzing output values corresponding to inputs of neural network trained in unsupervised learning and categorizing the output values into groups.

Figure 21:
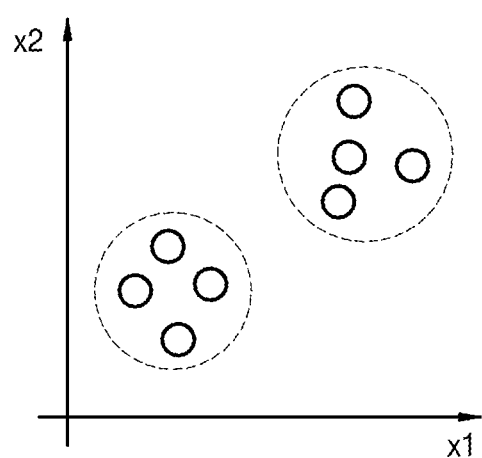
FIG. 21 is a graph about unsupervised learning.

Referring to FIG. 21, a relationship between an output x2 corresponding to an input x1 to a neural network trained in unsupervised learning may be determined, thereby determining a cluster. For example, output values corresponding t0 input values input to a neural network trained in unsupervised learning may be compared to one another and coordinates close to one another may be grouped into a single cluster. Referring to FIG. 21, coordinates of input values and output values are indicated by circles, and clusters including coordinates close to one another are indicated by dotted lines.

According to the above-stated embodiments, a weighting device exhibiting a multi-level characteristic may be embodied. According to the above-stated embodiments, a weighting device that may be operated with a low voltage may be embodied.

According to the above-stated embodiments, a 4-terminal weighting device may perform a write operation, a read operation, and an erase operation.

According to the above-stated embodiments, a 3-terminal weighting device is a modification of a 4-terminal weighting device and may prevent a current leakage to a source electrode.

According to the above-stated embodiments, a 6-terminal weighting device may have a relatively large multi-level characteristic.

According to the above-stated embodiments, weighting devices may be utilized in a neural network by being connected to one another.

It should be understood that example embodiments described herein should be considered in a descriptive sense only and not for purposes of limitation. Descriptions of features or aspects within each embodiment should typically be considered as available for other similar features or aspects in other embodiments.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A weighting device comprising:
a substrate;
a first transistor including,
 a source region and a shared region spaced apart from each other on the substrate;
 a source electrode electrically connected to the source region;
 a first channel region between the source region and the shared region;
 a first gate insulation layer arranged on the first channel region;
 a charge trap material layer arranged on the first gate insulation layer;
 a switching layer arranged on the charge trap material layer and configured to switch between a low resistance state and a high resistance state and configured to transfer charges into the charge trap material layer when the switching layer is in the low resistance state; and
 a first gate electrode arranged on the switching layer; and a second transistor including,
 a drain region spaced apart from the shared region on the substrate;
 a drain electrode electrically connected to the drain region;
 a second channel region between the shared region and the drain region;
 a second gate insulation layer arranged on the second channel region; and
 a second gate electrode arranged on the second gate insulation layer,
 wherein the charge trap material layer faces a portion of the shared region across the first gate insulation layer.

2. The weighting device of claim 1 wherein,
the first transistor further includes an anti-leakage region on the substrate,
the anti-leakage region constitutes a PN diode structure together with the source region, and
the source electrode contacts the anti-leakage region.

3. The weighting device of claim 2, wherein, except a surface of the anti-leakage region contacting the source electrode, the anti-leakage region is surrounded by the source region.

4. The weighting device of claim 1, wherein the first channel region and the second channel region have conductive types opposite each other.

5. The weighting device of claim 4 wherein,
the first transistor further includes a well,
the well surrounds the source region, the first channel region, and the shared region at the substrate, and
the well has a conductive type opposite that of the second channel region.

6. The weighting device of claim 1, wherein the first gate electrode and the source electrode are electrically connected to each other.

7. The weighting device of claim 1, further comprising:
a boosting electrode that faces the charge trap material layer across the first gate insulation layer and the substrate.

8. The weighting device of claim 1, wherein the switching layer comprises:
a nano-filamentary material switchable to the low resistance state as conductive nano-filaments are formed therein when a voltage is applied to the switching layer.

9. The weighting device of claim 1, wherein the switching layer comprises:
a PN diode layer.

10. A method of operating the weighting device of claim 1, the method comprising:
opening the second channel region by applying a selection voltage to the second gate electrode;
applying a write voltage to the drain electrode; and
grounding the first gate electrode,
wherein data is written to the charge trap material layer as charges are introduced into the charge trap material layer via the first gate electrode due to the write voltage.

11. A method of operating the weighting device of claim 1, the method comprising:
opening the second channel region by applying a selection voltage to the second gate electrode;
applying an erase voltage to the first gate electrode; and
grounding the drain electrode,
wherein data is erased as charges trapped in the charge trap material layer are removed by the erase voltage.

12. A method of operating the weighting device of claim 1, the method comprising:
opening the second channel region by applying a selection voltage to the second gate electrode;
applying a read voltage to the source electrode; and
reading an amount of charges trapped in the charge trap material layer by measuring a sensing current at the drain electrode.

13. The method of claim 10 wherein,
the applying of the write voltage includes adjusting a weight by applying a pulse voltage to the drain electrode, and
the adjusting of the weight is controlled based on a number of times of applying the pulse voltage.

14. The method of claim 11 wherein,
the applying of the erase voltage includes adjusting a weight by applying a pulse voltage to the first gate electrode, and
the adjusting of the weight is controlled based on a number of times of applying the pulse voltage.

15. A neural network comprising:
a plurality of weighting devices of claim 1; and
a plurality of neuron transistors configured to selectively switch gate voltages applied to the plurality of weighting devices.

16. The neural network of claim 15 wherein,
the plurality of neuron transistors are 2-dimensionally arranged,
drain electrodes of the plurality of neuron transistors are respectively connected to first gate electrodes of the plurality of weighting devices, and
the neural network further comprises:
a select line connected to gate electrodes of neuron transistors arranged at a same column, the select line being configured to apply a selection voltage; and
an input line connected to source electrodes of neuron transistors arranged at a same row, the input line being configured to apply an input voltage.

17. The neural network of claim 15, wherein the plurality of weighting devices are 1-dimensionally or 2-dimensionally arranged.

18. A method of operating the neural network of claim 15 for supervised learning, wherein input information to be input via the plurality of neuron transistors and output information to be output via the plurality of weighting devices is determined in advance and a weight of the neural network corresponding thereto is determined.

19. A method of operating the neural network of claim 15 for unsupervised learning, wherein a weight of the neural network is autonomously determined based on input information input via neuron transistors.

20. A weighting device comprising:
a first transistor including a third gate electrode, a first electrode, and a second electrode;
a second transistor sharing the second electrode with the first transistor and including a fourth gate electrode and a third electrode;
a third transistor including a fifth gate electrode and a fourth electrode and configured to use a shared region as a drain;
a fourth transistor including a sixth gate electrode and a fifth electrode and configured to use the shared region as a source;
a switching layer arranged on the first electrode and the third electrode and configured to switch between a high resistance state and a low resistance state;
a charge trap material layer arranged on the switching layer and configured to trap or release charges according to a resistance state of the switching layer; and
an interconnect interconnecting the charge trap material layer and the sixth gate electrode.

* * * * *